(12) United States Patent
Kubota et al.

(10) Patent No.: US 8,654,292 B2
(45) Date of Patent: Feb. 18, 2014

(54) LIQUID CRYSTAL DISPLAY DEVICE AND METHOD FOR MANUFACTURING THE SAME

(75) Inventors: Daisuke Kubota, Kanagawa (JP); Akio Yamashita, Kanagawa (JP); Tetsuji Ishitani, Kanagawa (JP); Tomohiro Tamura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 444 days.

(21) Appl. No.: 12/779,604

(22) Filed: May 13, 2010

(65) Prior Publication Data

US 2010/0302492 A1 Dec. 2, 2010

(30) Foreign Application Priority Data

May 29, 2009 (JP) ................................. 2009-131384

(51) Int. Cl.
*G02F 1/1333* (2006.01)

(52) U.S. Cl.
USPC .......................................... 349/138; 349/147

(58) Field of Classification Search
None
See application file for complete search history.

(56) References Cited

U.S. PATENT DOCUMENTS

| | | | |
|---|---|---|---|
| 4,409,134 A | 10/1983 | Yamazaki | |
| 6,097,465 A | 8/2000 | Hiroki et al. | |
| 6,175,395 B1 | 1/2001 | Yamazaki et al. | |
| 7,211,825 B2 | 5/2007 | Shih et al | |
| 7,327,433 B2 | 2/2008 | Miyachi et al. | |
| 7,576,829 B2 | 8/2009 | Kikuchi et al. | |
| 7,978,301 B2 | 7/2011 | Takeda et al. | |
| 8,120,746 B2 | 2/2012 | Shibahara et al. | |
| 2005/0179847 A1* | 8/2005 | Miyachi et al. | 349/141 |
| 2006/0203169 A1 | 9/2006 | Ozawa et al. | |
| 2006/0227283 A1 | 10/2006 | Ooi et al. | |
| 2007/0070282 A1 | 3/2007 | Shibahara et al. | |
| 2007/0126969 A1 | 6/2007 | Kimura et al. | |
| 2008/0259254 A1 | 10/2008 | Kikuchi et al. | |
| 2009/0153761 A1* | 6/2009 | Park et al. | 349/43 |
| 2009/0284693 A1* | 11/2009 | Adachi et al. | 349/98 |

FOREIGN PATENT DOCUMENTS

| | | |
|---|---|---|
| EP | 1 876 489 A2 | 1/2008 |
| JP | 2007-086205 | 4/2007 |
| JP | 2007-171740 | 7/2007 |
| JP | 2008-033311 | 2/2008 |
| JP | 2008-112022 | 5/2008 |
| JP | 2008-233915 | 10/2008 |
| JP | 2009-086576 | 4/2009 |
| WO | WO 2005/090520 A1 | 9/2005 |

* cited by examiner

*Primary Examiner* — Kaveh Kianni
(74) *Attorney, Agent, or Firm* — Nixon Peabody LLP; Jeffrey L. Costellia

(57) ABSTRACT

A liquid crystal display device using a liquid crystal exhibiting a blue phase and having a novel structure, and a method for manufacturing the liquid crystal display device. A plurality of structure bodies (also referred to as ribs, protrusions, or projecting portions) are formed over the same substrate, and a pixel electrode and an electrode (a common electrode at a fixed potential) corresponding to the pixel electrode are formed thereover. An electric field is applied to the liquid crystal layer exhibiting a blue phase by using the pixel electrode that has an inclination and the electrode corresponding to the pixel electrode, which also has an inclination. A shorter distance between the adjacent structure bodies allows a strong electric field to be applied to the liquid crystal layer, which results in a reduction in power consumption for driving the liquid crystal.

26 Claims, 20 Drawing Sheets

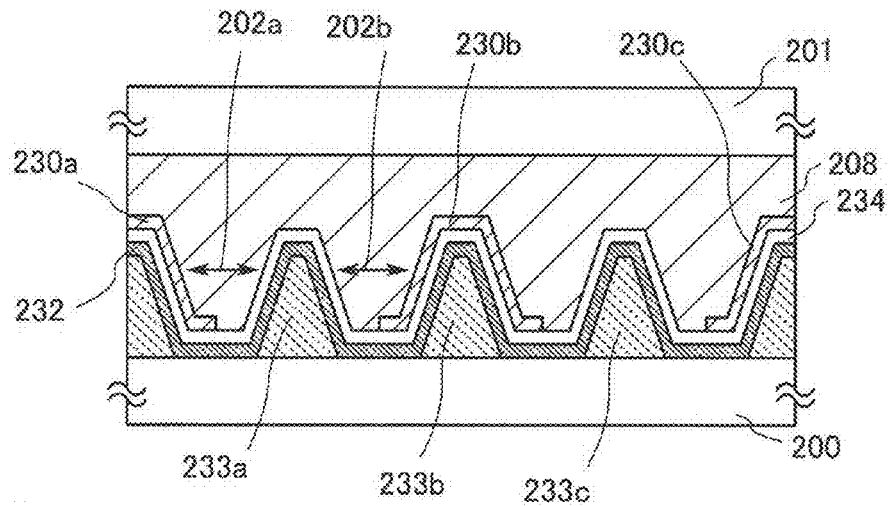
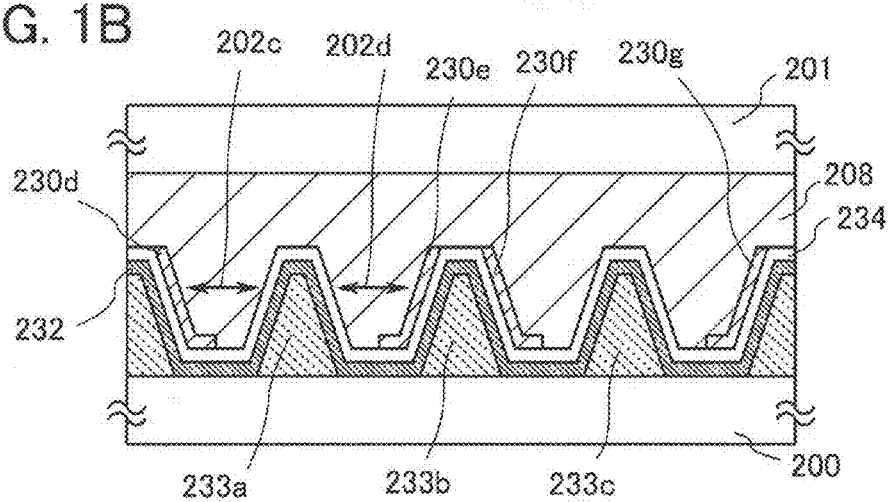
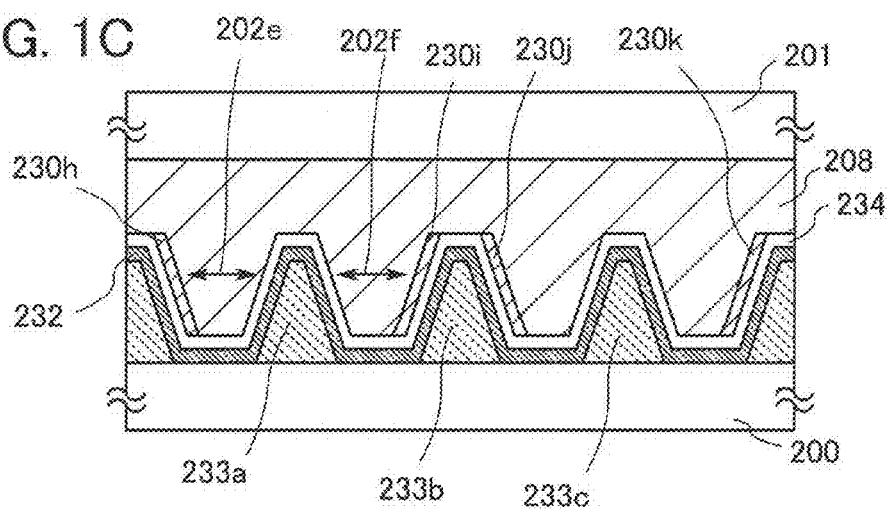

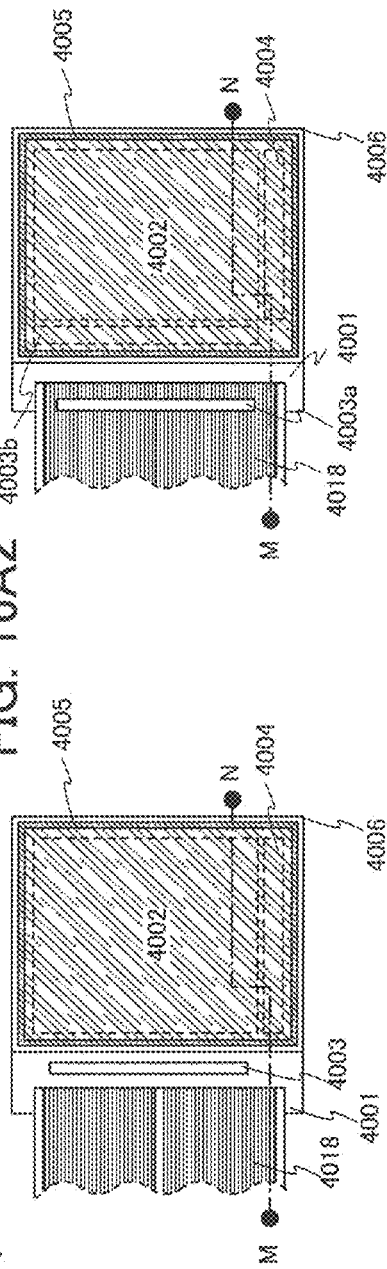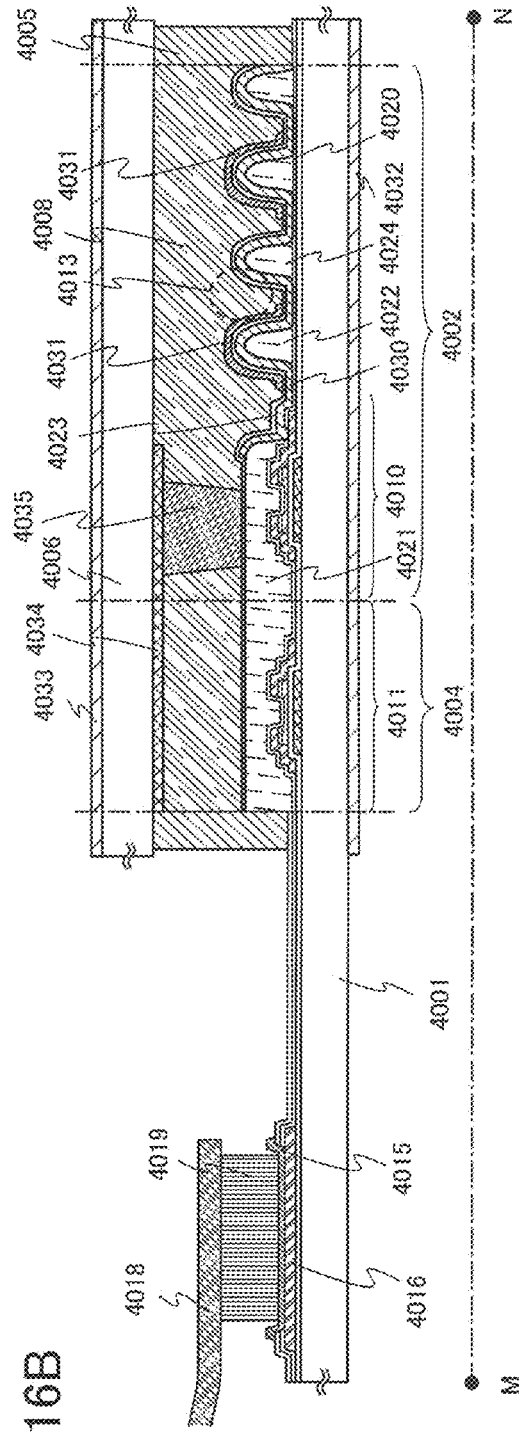

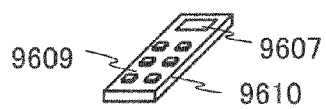

LIQUID CRYSTAL DISPLAY DEVICE AND METHOD FOR MANUFACTURING THE SAME

BACKGROUND OF THE INVENTION

Field of the Invention

The present invention relates to a semiconductor device including a circuit formed with a thin film transistor (hereinafter referred to as a TFT), and a method for manufacturing the semiconductor device. The present invention relates to, for example, an electronic appliance on which an electro-optical device typified by a liquid crystal display panel is mounted as a component.

Note that in this specification, a semiconductor device refers to all devices that can operate by using semiconductor characteristics, and an electro-optical device, a semiconductor circuit, and an electronic appliance are all included in the semiconductor device.

Recent attention has focused on techniques for forming a thin film transistor (a TFT) by using a semiconductor thin film (with a thickness of about several nanometers to several hundred nanometers) formed over a substrate having an insulating surface. Thin film transistors are applied to a wide range of electronic devices such as ICs and electro-optical devices and have been rapidly developed, particularly as switching elements in an image display device.

A liquid crystal display device is a typical example of the image display device. As a liquid crystal display mode, an IPS (In-Plane-Switching) mode and an FFS (Fringe Field Switching) mode as well as a typical TN (Twisted Nematic) mode have been proposed.

Further, liquid crystal display devices using a liquid crystal exhibiting a blue phase have been attracting attention. It is disclosed by Kikuchi et al. that the temperature range of the blue phase can be widened by polymer stabilization treatment, which is leading the way to practical application of the liquid crystal exhibiting a blue phase (see Patent Document 1).

REFERENCE

Patent Document

[Patent Document 1] PCT International Publication No. WO2005/090520

SUMMARY OF THE INVENTION

A liquid crystal material exhibiting a blue phase has a short response time of 1 millisecond or less in the state of applying no voltage to the state of applying voltage and allows high-speed response.

In the case of using a liquid crystal exhibiting a blue phase, an electric field parallel to a substrate contributes to driving. A pair of electrodes provided over a substrate form an electric field parallel to the substrate, so that optical modulation of a liquid crystal can be obtained. In that case, since a liquid crystal exhibiting a blue phase generally has high viscosity, an effective voltage cannot be applied sufficiently to some regions when a voltage (an applied voltage) is applied between the pair of electrodes.

According to one embodiment of the present invention, a liquid crystal display device having a novel structure and a method for manufacturing the same will be provided by using a liquid crystal exhibiting a blue phase.

A liquid crystal display device includes: a pair of substrates; a liquid crystal layer exhibiting a blue phase, which is sealed between the pair of substrates; and a pair of electrodes for applying a voltage to the liquid crystal layer. One of the pair of electrodes is also referred to as a pixel electrode. At least one of the pair of substrates is a substrate transmitting visible light, and typically, a glass substrate is used. In a display area, a plurality of gate wirings arranged in parallel to each other are provided to cross a plurality of source signal lines. The pair of electrodes including the pixel electrode are provided in an area separated by the plurality of gate wirings and the plurality of source signal lines. An electric field is applied to the liquid crystal layer exhibiting a blue phase by using the pixel electrode that has an inclination and an electrode (a common electrode at a fixed potential) corresponding to the pixel electrode, which also has an inclination.

In the case of an active matrix liquid crystal display device, a display area includes switching elements electrically connected to pixel electrodes, typically, thin film transistors (also referred to as TFTs). A display pattern is formed on a screen when the pixel electrodes arranged in a matrix are driven. Specifically, when a voltage is applied between a selected pixel electrode and another electrode corresponding to the pixel electrode, a liquid crystal layer provided between the pixel electrode and the other electrode is optically modulated, and this optical modulation is recognized as a display pattern by an observer.

One embodiment of the present invention disclosed in this specification is a liquid crystal display device including: a first substrate and a second substrate between which a liquid crystal layer containing a liquid crystal material exhibiting a blue phase is held; a plurality of structure bodies over the first substrate; a first electrode layer over the plurality of structure bodies; an insulating layer over the first electrode layer; and a second electrode layer over the insulating layer, which overlaps the first electrode layer with the insulating layer interposed therebetween. The plurality of structure bodies are arranged at regular intervals. An angle between each side surface of the plurality of structure bodies and a plane surface of the first substrate is less than 90°. The second electrode layer overlaps the side surface of the structure body with the first electrode layer and the insulating layer interposed therebetween. The second electrode layer includes a plurality of openings.

In the above structure, the cross-sectional shape of each of the plurality of structure bodies (also referred to as ribs, protrusions, or projecting portions) is a trapezoid, a half ellipse, a half circle, a triangle, or a shape with the top end or the bottom end having a radius of curvature. Furthermore, each side surface of the plurality of structure bodies is inclined (less than 90°), whereby the insulating layer and the second electrode layer can be formed over the structure bodies with less defects in coverage in the case where the height of the structure body is less than a cell gap. Note that the cell gap refers to the maximum value of the thickness of a liquid crystal layer interposed between a pair of substrates. In the case where the inclination angle (also referred to as a taper angle) between the side surface of the structure body and the plane surface of the first substrate is as large as 90° or more, the insulating layer is not deposited on the side surfaces of the structure body, which may cause a short circuit between the first electrode and the second electrode. In the case where the inclination angle of the structure body is as small as less than 10°, it is difficult to reduce the distance between the adjacent structure bodies; accordingly, the electrodes formed on the opposite inclined surfaces are apart from each other, leading to difficulty in obtaining a sufficient effect. The distance between the centers of the adjacent structure bodies is 20 μm or less, preferably 10 μm or less. A shorter distance between the adjacent structure bodies allows a strong electric field to be applied to the liquid crystal layer, which results in a reduction in power consumption for driving the liquid crystal. When the inclination angle of the structure body is small and the distance between the adjacent structure bodies is too long, a strong electric field cannot be easily applied to the liquid crystal layer.

There is no particular limitation on the shape of the top surface of the structure body, and a rectangular shape, an elliptical shape, a circular shape, a waved shape, a zigzag shape, or the like can be employed. The height of the structure body is preferably determined by the voltage-transmittance characteristics of a liquid crystal used. An electro-optical effect (phase contrast) of a blue phase is small in general; therefore, in order to obtain a sufficient electro-optical effect, the height of the structure body needs to be in the range of 100 nm to the cell gap. In consideration of the electro-optical effect of a blue phase, the structure body is formed to be 10 μm or less in height. Accordingly, the structure body is preferably made of an organic resin material obtained by a coating method or the like.

Further, in the above structure, a storage capacitor can be formed with a pair of electrodes and an insulating layer interposed therebetween which is used as a dielectric. The pair of electrodes (the first electrode layer and the second electrode layer) between which the insulating layer is held are not electrically connected to each other. The storage capacitor has a suitably large capacitance, which is determined by the storage time, the leakage current of a thin film transistor arranged in a pixel portion, or the like. In addition, the storage capacitor needs to have a suitably small capacitance as compared to a signal line capacitance.

In the above structure, one of the pair of electrodes is a pixel electrode, which is electrically connected to a thin film transistor if it is provided in an active matrix liquid crystal display device, and the other of the pair of electrodes is a common electrode at a fixed potential (e.g., a ground potential). Either the common electrode or the pixel electrode has a top surface with a plurality of openings (also referred to as slits).

Further, in the above structure, a large storage capacitor is formed between the pixel electrode and the common electrode, whereby more stable operating characteristics can be obtained. Note that the storage capacitor is formed with an overlapping region of the pixel electrode, the common electrode, and an insulating layer that is used as a dielectric. In order to increase the storage capacitance, it is preferable that the insulating layer have a small thickness and be made of an inorganic insulating material obtained by PCVD or sputtering. The insulating layer has a thickness of 10 nm to 600 nm, preferably 50 nm to 300 nm.

The present invention also has a feature in the arrangement of at least three structure bodies and the positional relationship between a first electrode layer and a second electrode layer, and a liquid crystal display device includes: a first substrate and a second substrate between which a liquid crystal layer containing a liquid crystal material exhibiting a blue phase is held; a first structure body, a second structure body, and a third structure body over the first substrate; a first electrode layer over the first structure body, the second structure body, and the third structure body; an insulating layer over the first electrode layer; and a second electrode layer which overlaps a side surface of the first structure body and a side surface of the third structure body with the insulating layer interposed therebetween. The second electrode layer includes an opening. The first structure body, the second structure body, and the third structure body are arranged at regular intervals. The second structure body is provided between the first structure body and the third structure body. The opening in the second electrode layer overlaps the second structure body.

By providing a stack of the first electrode layer, the insulating layer, and the second electrode layer over a side surface of at least one structure body, an electric field including that in the direction parallel to a surface of the first substrate (a plane surface of the first substrate) is generated between the second electrode layer formed over the side surface of the one structure body and the first electrode layer formed over a side surface of a structure body adjacent to the one structure body. Thus, liquid crystal molecules are moved in a surface parallel to the surface of the first substrate, thereby controlling gray scales.

According to each of the above structures, an electric field including that in the direction substantially parallel to the first substrate (i.e., the horizontal direction) is generated, whereby a wide viewing angle can be achieved.

In each of the above structures, when the first electrode layer serves as a common electrode at a fixed potential, the second electrode layer serves as a pixel electrode electrically connected to a thin film transistor. The present invention also has a feature in manufacturing steps in that case, and a method for manufacturing a liquid crystal display device includes the steps of: forming a gate electrode layer and a plurality of structure bodies over a first substrate; forming a first electrode layer over the structure bodies; forming an insulating layer to cover the gate electrode layer and the first electrode layer; forming a semiconductor layer over the insulating layer, which overlaps the gate electrode layer; forming a conductive layer over the semiconductor layer; forming a second electrode layer over the conductive layer, which is electrically connected to the semiconductor layer; and fixing a second substrate to the first substrate with a liquid crystal layer interposed therebetween. The second electrode layer partly overlaps the structure bodies, the first electrode layer, and the insulating layer. In the structure obtained by this manufacturing method, a part of the insulating layer serves as a gate insulating film of the thin film transistor, another part of the insulating layer insulates the first electrode layer from the second electrode layer, and a storage capacitor is formed with an overlapping portion of the first electrode layer, the insulating layer, and the second electrode layer.

Furthermore, a third electrode layer is formed on the second substrate. The third electrode layer is at the same potential as the first electrode layer (a fixed potential), and the third electrode layer overlaps the first electrode layer with the liquid crystal layer interposed therebetween. The third electrode layer allows increasing the area of an electric field applied to the liquid crystal layer. The third electrode layer also allows a strong electric field to be applied to the liquid crystal layer, resulting in a reduction in power consumption for driving the liquid crystal. The third electrode layer is arranged so as not to overlap the second electrode layer with the liquid crystal layer interposed therebetween.

In each of the above structures, when the first electrode layer serves as a pixel electrode electrically connected to the thin film transistor, the second electrode layer serves as a common electrode at a fixed potential. In the case where the second electrode layer is at a fixed potential and the third electrode layer is formed on the second substrate, the third electrode layer is at the same potential as the second electrode layer (a fixed potential). The third electrode layer allows a strong electric field to be applied to the liquid crystal layer, resulting in a reduction in power consumption for driving the liquid crystal. The third electrode layer is arranged so as to overlap the second electrode with the liquid crystal layer interposed therebetween.

In each of the above structures, since a liquid crystal material exhibiting a blue phase is used for the liquid crystal layer, switching of color for displaying one color in one field can be performed in 1/180 seconds or less, i.e., about 5.6 milliseconds or less. The liquid crystal material exhibiting a blue phase has a short response time of 1 millisecond or less and allows high-speed response, resulting in higher performance of a liquid crystal display device. The liquid crystal material exhibiting a blue phase includes a liquid crystal and a chiral agent. The chiral agent is employed to align the liquid crystal in a helical structure and to make the liquid crystal exhibit a blue phase. For example, a liquid crystal material including a chiral agent mixed at 5 wt % or more may be used for the liquid crystal layer. As the liquid crystal, a thermotropic liquid crystal, a low-molecular liquid crystal, a high-molecular liquid crystal, a ferroelectric liquid crystal, an anti-ferroelectric liquid crystal, or the like is used. These liquid crystal materials exhibit a cholesteric phase, a cholesteric blue phase, a smectic phase, a smectic blue phase, a cubic phase, a chiral nematic phase, an isotropic phase, or the like depending on conditions. As the chiral agent, a material having a high compatibility with a liquid crystal and a strong twisting power is used. Furthermore, either R-enantiomer or S-enantiomer is preferably used, and a racemic mixture containing R- and S-enantiomers at 50:50 is not used.

A cholesteric blue phase and a smectic blue phase, which are kinds of blue phase, are observed in a liquid crystal material having a cholesteric phase or a smectic phase with a relatively short helical pitch of 500 nm or less. The alignment of the liquid crystal material has a double twist structure. Having the order of less than or equal to an optical wavelength, the liquid crystal material is transparent, and optical modulation action occurs through a change in alignment order by voltage application. The blue phase is optically isotropic and thus has no viewing angle dependence and does not require an alignment film, resulting in an improvement in display image quality and cost reduction.

The blue phase appears only within a narrow temperature range; therefore, it is preferable that a photocurable resin and a photopolymerization initiator be added to a liquid crystal material and polymer stabilization treatment be performed in order to extend the temperature range. The polymer stabilization treatment is performed in such a manner that a liquid crystal material including a liquid crystal, a chiral agent, a photocurable resin, and a photopolymerization initiator is irradiated with light having a wavelength, with which the photocurable resin and the photopolymerization initiator react. Light irradiation in this polymer stabilization treatment may be performed in the state where a liquid crystal material exhibits an isotropic phase or a blue phase under the control of temperature. For example, the polymer stabilization treatment is performed in the following manner: the temperature of a liquid crystal layer is controlled so as to exhibit a blue phase, and the liquid crystal layer is irradiated with light in that state. Note that the polymer stabilization treatment is not limited to this manner and may be carried out by performing light irradiation in the state where a liquid crystal layer exhibits an isotropic phase at a temperature within +10° C., preferably +5° C. of the phase transition temperature between the blue phase and the isotropic phase. The phase transition temperature between the blue phase and the isotropic phase is a temperature at which the phase changes from the blue phase to the isotropic phase when the temperature rises, or a temperature at which the phase changes from the isotropic phase to the blue phase when the temperature falls. An example of the polymer stabilization treatment is as follows: after a liquid crystal layer is heated to exhibit an isotropic phase, the liquid crystal layer is gradually cooled to exhibit a blue phase and then irradiated with light while keeping the temperature at which the blue phase is exhibited. Alternatively, after a liquid crystal layer is gradually heated to exhibit an isotropic phase, the liquid crystal layer can be irradiated with light at a temperature within +10° C., preferably +5° C. of the phase transition temperature between the blue phase and the isotropic phase (in the state of exhibiting the isotropic phase). In the case where an ultraviolet curable resin (a UV curable resin) is used as the photocurable resin included in the liquid crystal material, the liquid crystal layer may be irradiated with ultraviolet rays. Even in the case where the blue phase is not exhibited, if polymer stabilization treatment is performed by irradiation with light at a temperature within +10° C., preferably +5° C. of the phase transition temperature between the blue phase and the isotropic phase (in the state of exhibiting the isotropic phase), the response time can be made as short as 1 millisecond or less and high-speed response is possible.

In this specification, a gate electrode layer refers to a portion which overlaps a semiconductor layer with a gate insulating film interposed therebetween and overlaps a portion forming a channel of a thin film transistor, and a gate wiring layer refers to the other portion. Note that a part of a pattern made of the same conductive material is a gate electrode layer and the other part is a gate wiring layer.

In this specification, a semiconductor layer of a thin film transistor may be a semiconductor film containing silicon as its main component or a semiconductor film containing a metal oxide as its main component. Examples of the semiconductor film containing silicon as its main component include an amorphous semiconductor film, a semiconductor film having a crystalline structure, and a compound semiconductor film having an amorphous structure, and specifically, amorphous silicon, microcrystalline silicon, polycrystalline silicon, single crystal silicon, or the like can be used. For the semiconductor film containing a metal oxide as its main component, zinc oxide (ZnO), indium gallium zinc oxide (In—Ga—Zn—O), or the like can be used.

In this specification, a thin film transistor may have a variety of structures, and for example, a top-gate TFT, a bottom-gate TFT, a bottom-contact TFT, or a staggered TFT can be employed. Further, it is possible to use not only a transistor with a single-gate structure, but also a multi-gate transistor having a plurality of channel forming regions, e.g., a double-gate transistor, Moreover, a dual-gate transistor having gate electrodes above and below a semiconductor layer may also be used.

In this specification, a term indicating a direction such as "on", "over", "under", "below", "side", "horizontal", or "perpendicular" is based on the assumption that a device is provided over the surface of a first substrate.

The pixel electrode having an inclination and the electrode (the common electrode at a fixed potential) corresponding to the pixel electrode, which also has an inclination, make it possible to achieve high-speed response, high transmittance, or a wide viewing angle of a liquid crystal display device.

BRIEF DESCRIPTION OF THE DRAWINGS

In the accompanying drawings:

FIGS. 1A to 1C are cross-sectional views of one embodiment of the present invention;

FIGS. 16A1 and 16A2 are top views and FIG. 16B is a cross-sectional view of a liquid crystal module;

DETAILED DESCRIPTION OF THE INVENTION

Figure 2A:
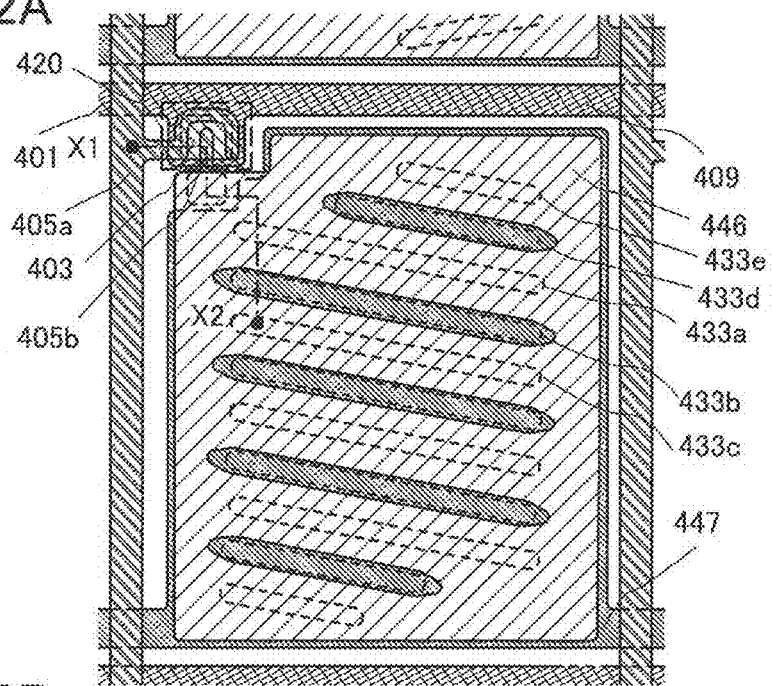
FIGS. 2A and 2B are respectively a top view and a cross-sectional view of one embodiment of the present invention.

Embodiments of the present invention will be described in detail with reference to drawings. Note that the present invention is not limited to the description below, and it is apparent to those skilled in the art that modes and details can be modified in various ways. Accordingly, the present invention should not be construed as being limited to the description of the embodiments given below.

(Embodiment 1)

In one mode of this embodiment, an example of the positional relationship between a first electrode layer and a second electrode layer in a liquid crystal display device will be illustrated in FIG. 1A.

FIG. 1A is an example of a schematic cross-sectional view of a liquid crystal cell.

FIG. 1A illustrates a liquid crystal display device in which a first substrate 200 and a second substrate 201 are arranged to face each other and a liquid crystal layer 208 using a liquid crystal material exhibiting a blue phase is held between the first substrate 200 and the second substrate 201. The liquid crystal display device includes, between the first substrate 200 and the liquid crystal layer 208, structure bodies 233a, 233b, and 233c, a first electrode layer 232 serving as a common electrode, an insulating layer 234, and second electrode layers 230a, 230b, and 230c serving as pixel electrodes. The second electrode layers 230a, 230b, and 230c serving as pixel electrodes are electrically connected to each other, and have a top surface including openings (slits) overlapping the structure bodies 233a and 233c. The structure bodies 233a, 233b, and 233c are provided to project into the liquid crystal layer 208 from the surface of the first substrate 200 on which the liquid crystal layer 208 is provided.

The first electrode layer 232 serving as a common electrode is formed over the structure bodies 233a, 233b, and 233c provided over the first substrate 200. The insulating layer 234 is formed to cover the first electrode layer 232 serving as a common electrode. The second electrode layer 230b is formed over the insulating layer 234 to overlap the structure body 233b.

In the liquid crystal display device of FIG. 1A, when an electric field is applied between the first electrode layer 232 serving as a common electrode and the second electrode layers 230a, 230b, and 230c serving as pixel electrodes which have an opening pattern and hold a liquid crystal, a horizontal electric field (in a direction parallel to the first substrate) is applied to the liquid crystal layer 208, whereby liquid crystal molecules can be controlled with the electric field.

For example, when a voltage is applied so that a potential difference is generated between the pixel electrode and the common electrode, a horizontal electric field indicated by an arrow 202a is applied between the second electrode layer 230a serving as the pixel electrode and the first electrode layer 232 serving as the common electrode, and a horizontal electric field indicated by an arrow 202b is applied between the second electrode layer 230b and the first electrode layer 232. A part of the first electrode layer 232 which is provided to overlap the structure body 233b overlaps the second electrode layer 230b with the insulating layer 234 interposed therebetween, thereby forming a storage capacitor. The horizontal electric field indicated by the arrow 202b is generated between a part of the first electrode layer 232 which is formed on an inclined surface of the structure body 233a and a part of the second electrode layer 230b which is formed on an inclined surface of the structure body 233b adjacent to the structure body 233a.

The structure bodies 233a, 233b, and 233c can be formed of an insulator using an insulating material (an organic insulating material and an inorganic insulating material) and a conductor using a conductive material (an organic material and an inorganic material). Typically, it is preferable to use a visible light curable resin, an ultraviolet curable resin, or a thermosetting resin, and for example, an acrylic resin, an epoxy resin, or an amine resin can be used. Alternatively, the structure bodies can be formed of a conductive resin or a metal material. Note that the structure bodies may have a stacked structure of plural thin films. The structure bodies may have a conical or pyramidal shape with a plane top surface and a trapezoidal cross section, a conical or pyramidal shape with a rounded dome top surface, or the like. The structure bodies 233a, 233b, and 233c only need to have a cross section with an inclined side surface. The structure bodies 233a, 233b, and 233c may have a step-like cross section including two or more steps on one side surface.

In FIG. 1A, the structure bodies 233a, 233b, and 233c have a trapezoidal cross section. The trapezoidal cross section, not a rectangular cross section, allows the second electrode layer 230b having an inclination to be formed on the side surface of the structure body 233b. The pixel electrode having an inclination and the first electrode layer 232 (the common electrode) corresponding to the pixel electrode, which also has an inclination, make it possible to achieve high-speed response, high transmittance, or a wide viewing angle of the liquid crystal display device.

FIG. 1B illustrates an example in which the second electrode layers serving as the pixel electrodes are arranged in a manner different from that illustrated in FIG. 1A. Second electrode layers 230d, 230e, 230f, and 230g serving as pixel electrodes are not provided at least over a part of the insulating layer 234 which overlaps the plane top surface of the structure body 233b. In FIG. 1B, a horizontal electric field indicated by an arrow 202c is applied between the second electrode layer 230d serving as the pixel electrode and the first electrode layer 232 serving as the common electrode, and a horizontal electric field indicated by an arrow 202d is applied between the second electrode layer 230e and the first electrode layer 232. As shown here, an effect similar to that shown in FIG. 1A can be obtained in the structure of FIG. 1B. Note that the area of the first electrode layer 232 which overlaps the pixel electrode with the insulating layer 234 interposed therebetween is smaller in FIG. 1B than in FIG. 1A; therefore, the structure of FIG. 1A is preferably used in order to increase the storage capacitance.

FIG. 1C illustrates an example in which the area of the pixel electrode is even smaller than that of FIG. 1B. Second electrode layers 230h, 230i, 230j, and 230k serving as pixel electrodes are provided only on the inclined surfaces of the structure body 233b. In FIG. 1C, a horizontal electric field indicated by an arrow 202e is applied between the second electrode layer 230h serving as the pixel electrode and the first electrode layer 232 serving as the common electrode, and a horizontal electric field indicated by an arrow 202f is applied between the second electrode layer 230i and the first electrode layer 232. As shown here, an effect similar to that shown in FIG. 1B can be obtained in the structure of FIG. 1C. Note that the area of the first electrode layer 232 which overlaps the pixel electrode with the insulating layer 234 interposed therebetween is smaller in FIG. 1C than in FIG. 1B; therefore, the structure of FIG. 1B is preferably used in order to increase the storage capacitance.

When the pixel electrode and the common electrode are provided at least on the side surface of the structure body to be inclined, a strong electric field can be applied to the liquid crystal layer and power consumption for driving a liquid crystal can be reduced.

Furthermore, even in the case where misalignment occurs in patterning of the pixel electrode, substantially the same electric field can be applied to the liquid crystal layer as long as the pixel electrode is provided to overlap at least the side surface of the structure body, and substantially the same storage capacitance can be obtained because the area of the pixel electrode which overlaps the common electrode remains almost unchanged even when misalignment occurs. Accordingly, patterning of the pixel electrode can be performed with a wide margin and high yield.

FIGS. 6B, 7B, 8B, and 20B show the results of calculating the electric field applied in liquid crystal display devices. FIGS. 6A, 7A, 8A, and 20A are diagrams illustrating the structures of the liquid crystal display devices used for calculation.

Figure 20A:
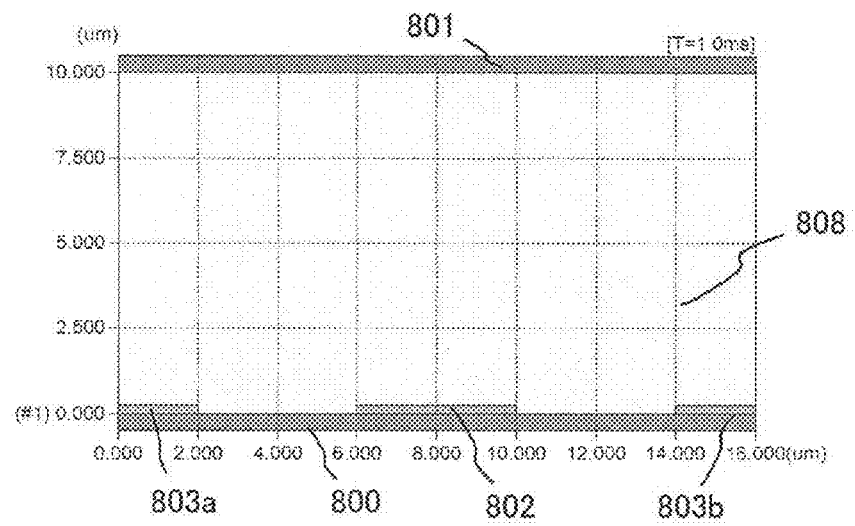
FIGS. 20A and 20B are graphs showing the result of calculating an electric field mode in a liquid crystal display device.
Figure 20B:
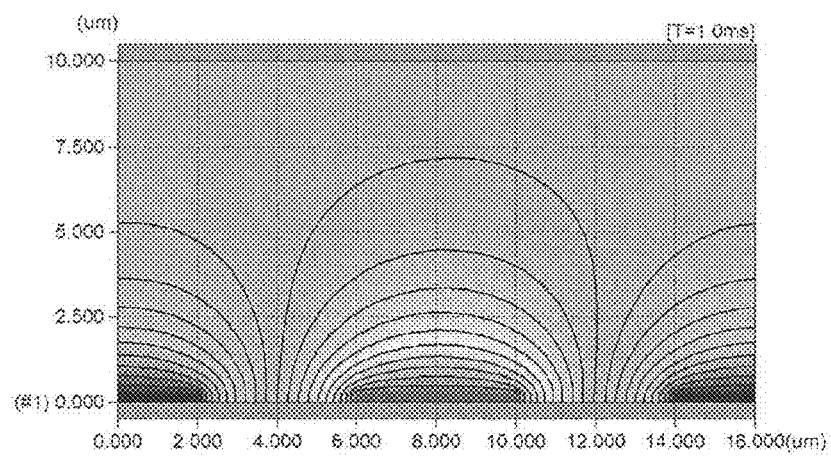

The calculation was performed using LCD Master, 2s Bench manufactured by Shintec Company Limited, and an insulator with a dielectric of 4 was used as the structure bodies 233a, 233b, and 233c. The structure bodies 233a, 233b, and 233c each have a thickness (height) of 5 μm. The cross sections of the second electrode layer 230a and a second electrode layer 802 serving as pixel electrodes, the first electrode layer 232 and first electrode layers 803a and 803b serving as common electrodes, and the insulating layer 234 each have a thickness of 0.25 μm, and the cross sections of the second electrode layer 802 and the first electrode layers 803a and 803b each have a width of 4 μm. The second electrode layer in FIGS. 6A and 6B has a bowl shape with a height of 5 μm and a width of 8 μm, the second electrode layer in FIGS. 7A and 7B has a V shape with a height of 4.75 μm and a width of 3.4 μm, and the second electrode layer in FIGS. 8A and 8B has a sloped shape with a height of 4.75 μm and a width of 2 μm. In FIGS. 20A and 20B, the distance between the second electrode layer 802 and each of the first electrode layers 803a and 803b in a direction parallel to the substrate is 6 μm, and the thickness of the liquid crystal layer is 10 μm. Note that a voltage applied to the first electrode layer serving as the common electrode is set to 0 V and a voltage applied to the second electrode layer serving as the pixel electrode is set to 10 V.

FIGS. 6A and 6B, FIGS. 7A and 7B, and FIGS. 8A and 8B are calculation results corresponding to FIG. 1A, FIG. 1B, and FIG. 1C, respectively.

FIGS. 20A and 20B show a comparative example, in which the first electrode layers 803a and 803b serving as the common electrodes and the second electrode layer 802 serving as the pixel electrode are alternately provided between a first substrate 800 and a liquid crystal layer 808, and sealed with a second substrate 801.

In FIGS. 6B, 7B, 8B, and 20B, a solid line represents an equipotential line marked at intervals of 0.5 V, and the arrangement of the pixel electrode and the common electrode corresponds to that illustrated in FIGS. 6A, 7A, 8A, and 20A, respectively.

Figure 6A:
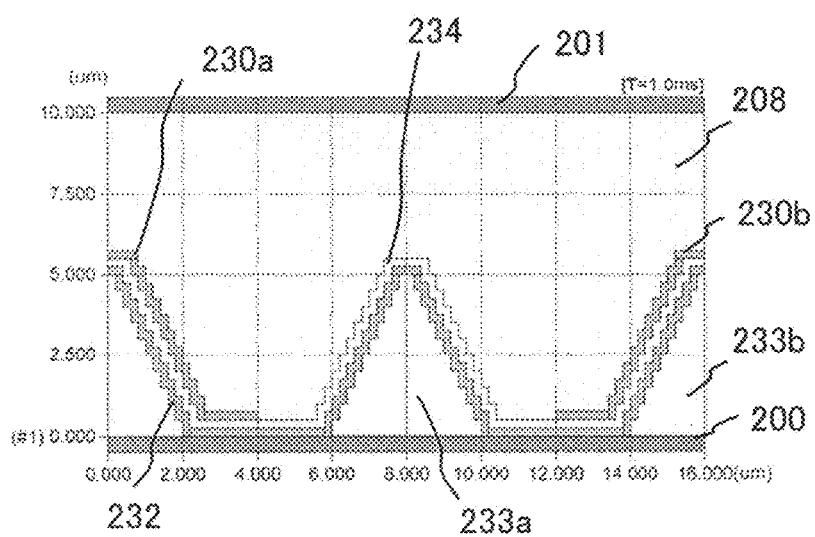
FIGS. 6A and 6B are graphs showing the result of calculating an electric field mode in a liquid crystal display device.
Figure 6B:
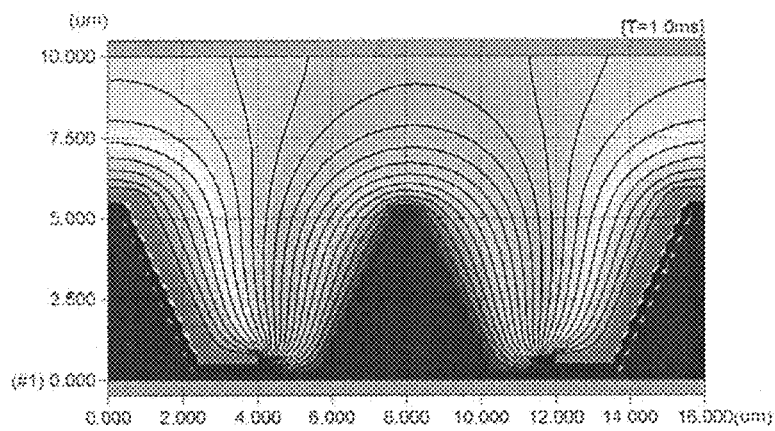
Figure 7A:
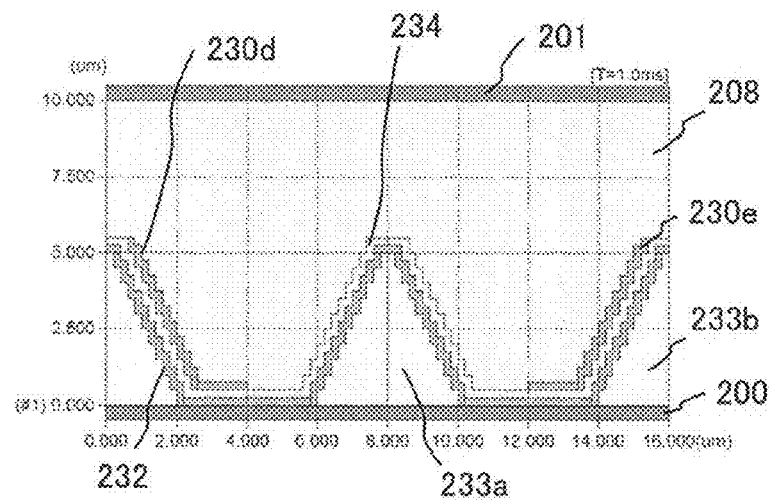
FIGS. 7A and 7B are graphs showing the result of calculating an electric field mode in a liquid crystal display device.
Figure 7B:
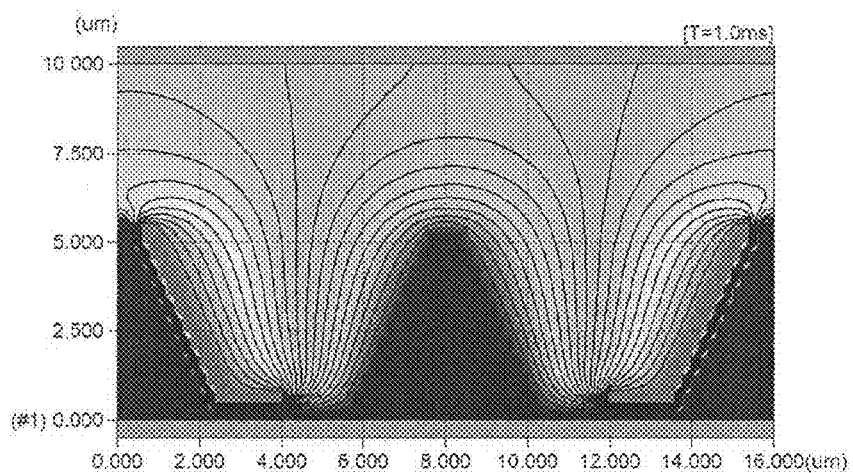
Figure 8A:
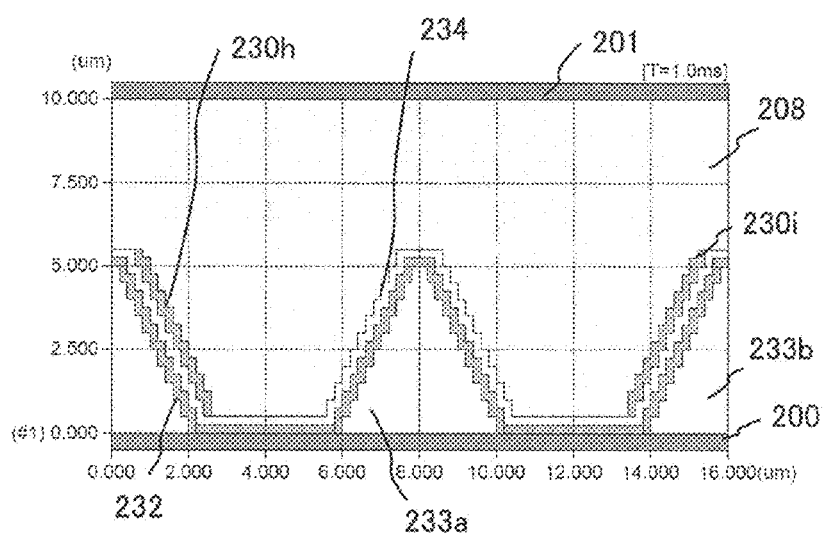
FIGS. 8A and 8B are graphs showing the result of calculating an electric field mode in a liquid crystal display device.
Figure 8B:
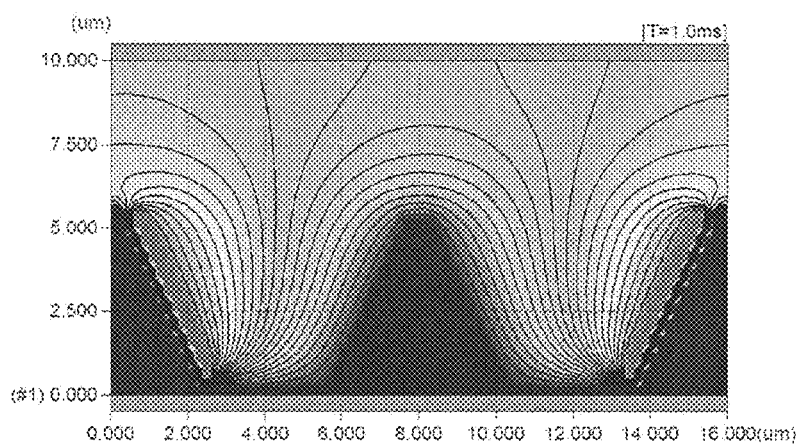

Since an electric field is applied perpendicularly to the equipotential line, it is found that a horizontal electric field is applied between the pixel electrode and the common electrode as illustrated in FIGS. 6B, 7B, and 8B. Even in the structure of FIG. 8A in which the pixel electrode is provided only on the inclined surface, an almost perpendicular equipotential line appears in FIG. 8B and a horizontal electric field is formed in a wide range of the liquid crystal layer.

On the other hand, in the comparative example of FIG. 20B, an equipotential line appears and an electric field is formed in the liquid crystal layer in the proximity of the first substrate 800 over which the second electrode layer 802 serving as the pixel electrode and the first electrode layers 803a and 803b serving as the common electrodes are alternately formed; however, the potential line disappears and a potential difference is not generated in the region where the liquid crystal layer gets closer to the second substrate 801. Thus, an electric field is not formed in the liquid crystal layer 808 in the proximity of the second substrate 801, and it is found that the response of all liquid crystal molecules in the liquid crystal layer is difficult to make in the structure of FIGS. 20A and 20B.

(Embodiment 2)

One embodiment of the invention disclosed in this specification can be applied to either a passive matrix liquid crystal display device or an active matrix liquid crystal display device. An example of the active matrix liquid crystal display device will be described with reference to FIGS. 2A and 2B.

Figure 2B:
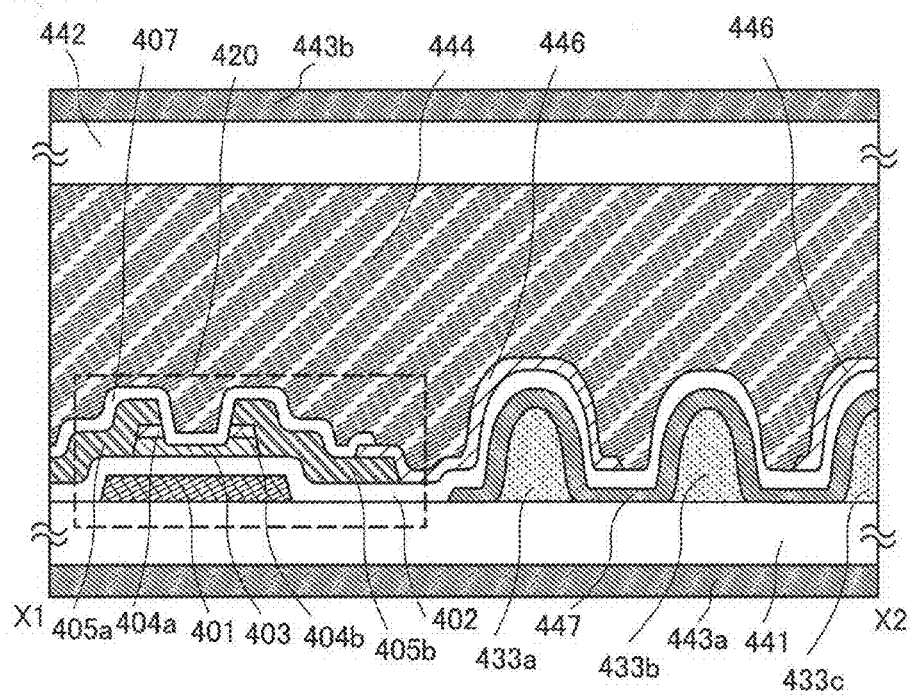

FIG. 2A is a plan view of a liquid crystal display device, which illustrates one pixel. FIG. 2B is a cross-sectional view along line X1-X2 of FIG. 2A.

In FIG. 2A, a plurality of source wiring layers (including a wiring layer 405a) are arranged to be parallel to each other (extend in the vertical direction in the drawing) and apart from each other. A plurality of gate wiring layers (including a gate electrode layer 401) are arranged to extend in a direction substantially perpendicular to the source wiring layers (in the horizontal direction in the drawing) and to be apart from each other. Common wiring layers are provided adjacent to the respective gate wiring layers and extend in a direction substantially parallel to the gate wiring layers, that is, in a direction substantially perpendicular to the source wiring layers (in the horizontal direction in the drawing). A roughly rectangular space is surrounded by the source wiring layers, the common wiring layers, and the gate wiring layers. In this space, a pixel electrode layer and a common electrode layer of the liquid crystal display device are provided. A thin film transistor 420 driving the pixel electrode layer is provided at the upper-left corner in the drawing. A plurality of pixel electrode layers and thin film transistors are provided in a matrix.

In the liquid crystal display device of FIGS. 2A and 2B, a second electrode layer 446 electrically connected to the thin film transistor 420 serves as a pixel electrode layer, and a first electrode layer 447 electrically connected to the common wiring layer serves as a common electrode layer. Note that a storage capacitor is formed with the pixel electrode layer and the common electrode layer. Although the common electrode layer can operate in a floating state (an electrically isolated state), the common electrode layer is set to a fixed potential, preferably to a potential around a common potential (an intermediate potential of an image signal which is transmitted as data) in such a level as not to generate flickers.

The first electrode layer 447 and the second electrode layer 446 can be formed of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the first electrode layer 447 and the second electrode layer 446. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

As illustrated in FIG. 2B, the first electrode layer 447 having a flat shape and the second electrode layer 446 having an opening pattern are provided under a liquid crystal layer 444. The flat-shaped first electrode layer 447 and the second electrode layer 446 having a pattern of a plurality of openings at least partly overlap each other with an insulating layer 402 interposed therebetween. A plurality of structure bodies are provided under the first electrode layer 447 at substantially regular intervals. In FIG. 2A, the top surface of the structure body has a rod shape with both ends in an arc, and the long axis of the top surface of the structure body is in a direction oblique to the gate wiring layer. In addition, the openings (also referred to as slits) in the second electrode layer 446 are arranged in the same direction as the structure bodies, that is, the long-axis direction of the top surface of the opening is oblique to the gate wiring layer.

As for the cross-sectional shapes of the plurality of structure bodies, the bottom end of the structure body has an elliptical or circular side surface having a center on the outside of the side surface of the structure body, and the top end of the structure body has an elliptical or circular side surface having a center on the inside of the side surface of the structure body. In other words, the bottom end of the structure body has a curved side surface that is determined by a center of curvature above a tangent to the bottom end and by a first radius of curvature, and the top end of the structure body has a curved side surface that is determined by a center of curvature below a tangent to the top end and by a second radius of curvature. Such cross-sectional shapes of the plurality of structure bodies can be obtained using a photosensitive resin and allows reducing defects in coverage with the first electrode layer 447, the insulating layer 402, and the second electrode layer 446 formed over the structure bodies.

In FIGS. 2A and 2B, a first structure body 433a, a second structure body 433b, a third structure body 433c, a fourth structure body 433d, and a fifth structure body 433e are arranged over a first substrate 441 at substantially regular intervals, and the first electrode layer 447 (e.g., a common electrode for applying a common voltage to all pixels) is formed thereover. Note that the first electrode layer 447 is also provided between the structure bodies.

The first electrode layer 447, the insulating layer 402, and the second electrode layer 446 are stacked on the side surfaces and top surface of the first structure body 433a. The first structure body 433a is adjacent to the fourth structure body 433d, and the top surface of the fourth structure body 433d is smaller in size than that of the first structure body 433a. Further, the fourth structure body 433d is adjacent to the fifth structure body 433e, and the top surface of the fourth structure body 433d is larger in size than that of the fifth structure body 433e.

The first electrode layer 447 and the insulating layer 402 are stacked on the side surfaces and top surface of the second structure body 433b adjacent to the first structure body 433a. The top surface of the second structure body 433b has substantially the same shape as the top surface of the first structure body 433a. In addition, the second structure body 433b overlaps the opening in the second electrode layer 446 as illustrated in FIG. 2A. Note that in FIG. 2A, the outline of each structure body is represented by a dotted line. The opening in the second electrode layer 446 is larger in area than the top surface of the second structure body 433b, and therefore the second structure body 433b does not overlap the second electrode layer 446.

The first electrode layer 447, the insulating layer 402, and the second electrode layer 446 are stacked on the side surfaces and top surface of the third structure body 433c adjacent to the second structure body 433b. The top surface of the third structure body 433c has substantially the same shape as the top surface of the first structure body 433a.

The first electrode layer 447 and the second electrode layer 446 are not electrically connected to each other. When a voltage is applied between the first electrode layer 447 and the second electrode layer 446, an electric field including at least an electric field parallel to a plane surface of the first substrate 441 can be formed between a part of the second electrode layer 446 which is provided on one inclined surface of the first structure body 433a and a part of the first electrode layer 447 which is provided on one inclined surface of the second structure body 433b facing the one inclined surface of the first structure body. At the same time, an electric field including at least an electric field parallel to the plane surface of the first substrate 441 can be formed between a part of the first electrode layer 447 which is provided on the other inclined surface of the second structure body 433b and a part of the second electrode layer 446 which is provided on one inclined surface of the third structure body 433c facing the other inclined surface of the second structure body 433b.

The second electrode layer 446 is electrically connected to the thin film transistor. The thin film transistor 420 is a bottom-gate thin film transistor and includes, over the first substrate 441 that is a substrate having an insulating surface, the gate electrode layer 401, the insulating layer 402 serving as a gate insulating layer, a semiconductor layer 403, n+ layers 404a and 404b serving as a source region and a drain region, and wiring layers 405a and 405b serving as a source electrode layer and a drain electrode layer. The first electrode layer 447 is formed over the first substrate 441 in the same layer as the gate electrode layer 401, and is a flat-shaped electrode layer in the pixel.

In this embodiment, a part of the insulating layer 402 serves as the gate insulating layer and another part serves as an insulating layer preventing a short circuit between the first electrode layer and the second electrode layer, resulting in a reduction in the number of steps.

The insulating layer 402 can be formed with a single layer or stacked layers of a silicon oxide layer, a silicon nitride layer, a silicon oxynitride layer, or a silicon nitride oxide layer, which is formed by plasma CVD, sputtering, or the like. Alternatively, a silicon oxide layer formed by CVD using an organosilane gas can be used for the insulating layer 402 serving as a gate insulating layer. As the organosilane gas, it is possible to use a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

An insulating film 407 is provided as a protective film to cover the thin film transistor 420 and be in contact with the semiconductor layer 403. The insulating film 407 covering the thin film transistor 420 can be formed with an inorganic insulating film or organic insulating film formed by a wet method or a dry method. For example, it is possible to use an inorganic insulating material such as a silicon nitride film, a silicon oxide film, or a silicon oxynitride film, which is formed by CVD, sputtering, or the like.

The liquid crystal layer 444 is made of a liquid crystal material exhibiting a blue phase, and sealed with a second substrate 442 that is a counter substrate. An optical film such as a polarizing plate, a retardation plate, an anti-reflection film, a color filter, a light-shielding film (also referred to as a black matrix) is provided as appropriate. For example, circular polarization by a polarizing plate and a retardation plate may be used. FIG. 2B illustrates a light-transmitting liquid crystal display device performing display by transmitting light from a light source; accordingly, the first substrate 441 and the second substrate 442 are light-transmitting substrates and polarizing plates 443a and 443b are provided on the respective outsides thereof (on the side opposite to the liquid crystal layer 444). As the light source, a backlight, a side light, or the like may be used. As the backlight or the side light, a plurality of light-emitting diodes (hereinafter referred to as LEDs) as well as a cold cathode fluorescent lamp can be used. As the method using LEDs, there are a method using a white LED and a method called a field-sequential method that uses a red LED, a green LED, and a blue LED and uses no color filter. The field-sequential method requires high-speed driving with at least three times higher speed. In this embodiment, the field-sequential method is used while a liquid crystal material exhibiting a blue phase is used; accordingly, switching of color for displaying one color in one field can be performed in $1/180$ seconds or less, i.e., about 5.6 milliseconds or less.

An insulating film serving as a base film may be provided between the first substrate 441, and the gate electrode layer 401 and the first electrode layer 447. The base film has a function of preventing diffusion of an impurity element from the substrate 441, and can be formed with a single layer or stacked layers of a silicon nitride film, a silicon oxide film, a silicon nitride oxide film, and a silicon oxynitride film. The gate electrode layer 401 can be formed with a single layer or stacked layers using a metal material such as molybdenum, titanium, chromium, tantalum, tungsten, aluminum, copper, neodymium, or scandium, or an alloy material containing any of these materials as its main component. The use a light-shielding conductive film for the gate electrode layer 401 can prevent light from a backlight (light emitted through the first substrate 441) from entering the semiconductor layer 403.

For example, as a two-layer structure of the gate electrode layer 401, the following two-layer structures are preferably used: an aluminum layer and a molybdenum layer stacked thereover, a copper layer and a molybdenum layer stacked thereover, a copper layer and a titanium nitride layer or a tantalum nitride layer stacked thereover, and a titanium nitride layer and a molybdenum layer stacked thereover. As a three-layer structure, it is preferable to use a stack of a tungsten layer or a tungsten nitride layer, a layer of an alloy of aluminum and silicon or an alloy of aluminum and titanium, and a titanium nitride layer or a titanium layer.

In this embodiment, an oxide semiconductor film is used as the semiconductor layer 403.

In this specification, a thin film represented by $InMO_3(ZnO)_m$ (m>0) is preferably used as an oxide semiconductor. In the thin film transistor 420, a thin film represented by $InMO_3(ZnO)_m$ (m>0) is formed and the thin film is used as the semiconductor layer 403. Note that M denotes one or more of metal elements selected from gallium (Ga), iron (Fe), nickel (Ni), manganese (Mn), and cobalt (Co). For example, M denotes Ga in some cases, and in other cases, M contains other metal elements in addition to gallium Ga, such as Ga and Ni or Ga and Fe. Furthermore, the above oxide semiconductor may contain a transition metal element such as Fe or Ni or an oxide of the transition metal as an impurity element in addition to a metal element contained as M. For example, an In—Ga—Zn—O-based non-single-crystal film can be used as the oxide semiconductor layer.

When M is gallium (Ga) in the $InMO_3(ZnO)_m$ (m>0) film (layer), this thin film is also called an In—Ga—Zn—O based non-single-crystal film in this specification. In the In—Ga—Zn—O-based non-single-crystal film, an amorphous structure is observed by X-ray diffraction (XRD) analysis even when the film is subjected to heat treatment at a temperature of 200° C. to 500° C., typically 300° C. to 400° C. for 10 minutes to 100 minutes after deposited by sputtering. In addition, it is possible to manufacture a thin film transistor having such electric characteristics as an on/off ratio of $10^9$ or more and a mobility of 10 or more at a gate voltage of −20 V to +20 V. An In—Ga—Zn—O-based non-single-crystal film deposited by sputtering using a target in which $In_2O_3:Ga_2O_3:ZnO$ is 1:1:1 has a photosensitivity at a wavelength of 450 nm or less.

An In—Ga—Zn—O-based non-single-crystal film can be used for the semiconductor layer 403 and the n+ layers 404a and 404b serving as a source region and a drain region. The n+ layers 404a and 404b are oxide semiconductor layers each having a lower resistance than the semiconductor layer 403. For example, the n+ layers 404a and 404b have n-type conductivity and an activation energy (ΔE) of 0.01 eV to 0.1 eV. The n+ layers 404a and 404b are In—Ga—Zn—O-based non-single-crystal films and include at least an amorphous component. The n+ layers 404a and 404b include a crystal grain (nanocrystal) in the amorphous structure in some cases. The crystal grain (nanocrystal) in the n+ layers 404a and 404b has a diameter of 1 nm to 10 nm, and typically about 2 nm to 4 nm.

By providing the n$^+$ layers 404a and 404b, a good contact can be made between the semiconductor layer 403 which is an oxide semiconductor layer and each of the wiring layers 405a and 405b which are metal layers, resulting in higher thermal stability than in Schottky junction. Actively providing the n$^+$ layers is effective in supplying carriers to the channel (on the source side), stably absorbing carriers from the channel (on the drain side), or preventing the formation of a resistance component at the interface between each of the wiring layers and the semiconductor layer. Furthermore, good mobility can be maintained even at a high drain voltage because of a lower resistance.

A first In—Ga—Zn—O-based non-single-crystal film used as the semiconductor layer 403 and a second In—Ga—Zn—O based non-single-crystal film used as the n$^+$ layers 404a and 404b are deposited under different conditions. For example, the flow rate ratio of oxygen gas to argon gas under the deposition conditions of the first In—Ga—Zn—O-based non-single-crystal film is higher than that under the deposition conditions of the second In—Ga—Zn—O-based non-single-crystal film. Specifically, the second In—Ga—Zn—O-based non-single-crystal film is deposited in a rare gas (such as argon or helium) atmosphere (or an atmosphere containing an oxygen gas at 10% or less and an argon gas at 90% or more), and the first In—Ga—Zn—O-based non-single-crystal film is deposited in an oxygen-mixed atmosphere (the flow rate of an oxygen gas is higher than that of an argon gas).

For example, with use of an oxide semiconductor target containing In, Ga, and Zn ($In_2O_3:Ga_2O_3:ZnO=1:1:1$), which has a diameter of 8 inches, the first In—Ga—Zn—O-based non-single-crystal film used as the semiconductor layer 403 is deposited in an argon atmosphere or an oxygen atmosphere at a distance between the substrate and the target of 170 mm, a pressure of 0.4 Pa, and a direct current (DC) power supply of 0.5 kW. Note that a pulsed direct current (DC) power supply is preferably used to reduce dust and obtain a uniform distribution of film thickness. The first In—Ga—Zn—O-based non-single-crystal film has a thickness of 5 nm to 200 nm.

On the other hand, the second oxide semiconductor film used as the n$^+$ layers 404a and 404b is deposited by sputtering with use of a target of $In_2O_3$, $Ga_2O_3$, and ZnO (1:1:1), at room temperature and at a pressure of 0.4 Pa, a power of 500 W, and an argon gas flow rate of 40 sccm. An In—Ga—Zn—O-based non-single-crystal film including a crystal grain having a diameter of 1 nm to 10 nm is formed in some cases immediately after deposition. It is said that the presence, density, and diameter of a crystal grain can be controlled by adjusting the deposition conditions of reactive sputtering as appropriate, such as the composition ratio of a target, the deposition pressure (0.1 Pa to 2.0 Pa), the power (250 W to 3000 W: 8 inches φ), or the temperature (room temperature to 100° C.). The diameter of the crystal grain is controlled within a range of 1 nm to 10 nm. The second In—Ga—Zn—O-based non-single-crystal film has a thickness of 5 nm to 20 nm. It is needless to say that the diameter of the crystal grain included in the film does not exceed the thickness of the film. In this embodiment, the second In—Ga—Zn—O-based non-single-crystal film has a thickness of 5 nm.

Examples of sputtering include an RF sputtering in which a high-frequency power source is used for a sputtering power source, a DC sputtering, and a pulsed DC sputtering in which a bias is applied in a pulsed manner. The RF sputtering is mainly used for depositing an insulating film, and the DC sputtering is mainly used for depositing a metal film.

Furthermore, there is also a multi-source sputtering apparatus in which a plurality of targets of different materials can be set. With the multi-source sputtering apparatus, films of different materials can be deposited to be stacked in the same chamber, or plural kinds of materials can be deposited by electric discharge at the same time in the same chamber There are also a sputtering apparatus provided with a magnet system inside the chamber and used for a magnetron sputtering, and a sputtering apparatus used for an ECR sputtering in which plasma generated with use of microwaves is used without using glow discharge.

As a deposition method by sputtering, there are also a reactive sputtering in which a target substance and a sputtering gas component are chemically reacted with each other during deposition to form a thin compound film thereof, and a bias sputtering in which voltage is also applied to a substrate during deposition.

In the manufacturing process of the semiconductor layer, the n$^+$ layers, and the wiring layers, a thin film is processed into a desired shape by an etching step. For the etching step, dry etching or wet etching can be performed.

As the etching gas used for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

Examples of the etching apparatus used for dry etching include an etching apparatus using a reactive ion etching method (an RIE method), or a dry etching apparatus using a high-density plasma source such as ECR (electron cyclotron resonance) or ICP (inductively coupled plasma). As a dry etching apparatus by which uniform electric discharge can be obtained over a wider area as compared to an ICP etching apparatus, there is an ECCP (enhanced capacitively coupled plasma) mode etching apparatus. An upper electrode of the ECCP mode etching apparatus is grounded, and a lower electrode thereof is connected to a high-frequency power source of 13.56 MHz and further to a low-frequency power source of 3.2 MHz. This ECCP mode etching apparatus can be applied to, for example, a substrate with a size exceeding 3 m of the tenth generation.

The etching conditions (e.g., the amount of electric power applied to a coiled electrode, the amount of electric power applied to an electrode on the substrate side, and the electrode temperature on the substrate side) are adjusted as appropriate so as to process a film into a desired shape.

Wet etching can be performed using a mixed solution of phosphoric acid, acetic acid, and nitric acid, or an ammonia hydrogen peroxide mixture (hydrogen peroxide:ammonia:water=5:2:2). Alternatively, ITO07N (produced by KANTO CHEMICAL CO., INC.) may be used.

An etchant used in wet etching is removed by cleaning together with materials which are etched away. Waste liquid of the etchant containing the removed materials may be purified to recycle the materials contained in the waste liquid. When the materials such as indium contained in the oxide semiconductor layer are collected from the waste liquid after etching and then recycled, resources can be effectively used and cost can be reduced.

The etching conditions (e. g., an etchant, etching time, and temperature) are adjusted as appropriate depending on the material so as to process a film into a desired shape.

The wiring layers 405a and 405b can be made of an element selected from Al, Cr, Ta, Ti, Mo, and W, an alloy containing any of these elements as its component, an alloy containing a combination of any of these elements, and the like. If heat treatment at 200° C. to 600° C. is performed, the conductive film preferably has heat resistance enough to withstand the heat treatment. Since aluminum alone has the disadvantages of low heat resistance, being easily corroded, and the like, it is used in combination with a conductive material having heat resistance. As the conductive material having heat resistance which is combined with aluminum, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

The insulating layer 402, the semiconductor layer 403, the n+ layers 404a and 404b, and the wiring layers 405a and 405b may be successively formed without being exposed to air. Successive formation of the layers without exposure to air makes it possible to form each interface between the stacked layers without being contaminated with atmospheric components or impurity elements contained in air. Thus, variations in characteristics of the thin film transistor can be reduced.

Note that the semiconductor layer 403 is partly etched so as to have a groove (a depressed portion).

The semiconductor layer 403 and the n+ layers 404a and 404b are preferably subjected to heat treatment at 200° C. to 600° C., typically 300° C. to 500° C. For example, heat treatment at 350° C. for one hour is performed in a nitrogen atmosphere. This heat treatment involves the rearrangement at the atomic level of the In—Ga—Zn—O-based oxide semiconductor included in the semiconductor layer 403 and the n+ layers 404a and 404b. This heat treatment (including light annealing) is important because the strain that inhibits the movement of carriers in the semiconductor layer 403 and the layers 404a and 404b can be released. Note that there is no particular limitation on the timing of the heat treatment, and the heat treatment may be performed at any time after the formation of the semiconductor layer 403 and the n+ layers 404a and 404b.

In addition, the exposed depressed portion of the semiconductor layer 403 may be subjected to oxygen radical treatment. The radical treatment is preferably performed in an atmosphere of $O_2$ or $N_2O$, or an atmosphere of $N_2$, He, Ar, or the like which contains oxygen. The radical treatment may also be performed in an atmosphere in which $Cl_2$ and/or $CF_4$ is/are added to the above atmosphere. Note that the radical treatment is preferably performed with no bias voltage applied to the first substrate 441 side.

There is no particular limitation on the structure of the thin film transistor formed in the liquid crystal display device. The transistor may have a single-gate structure including one channel formation region, a double-gate structure including two channel formation regions, or a triple-gate structure including three channel formation regions. Furthermore, a transistor in the peripheral driver circuit region may also have a single-gate structure, a double-gate structure, or a triple-gate structure.

The thin film transistor may have a top-gate structure (e.g., a staggered structure or a coplanar structure), a bottom-gate structure (e.g., an inverted-staggered structure or an inverted-coplanar structure), a dual-gate structure including two gate electrode layers provided over and under a channel region each with a gate insulating film interposed therebetween, or other structures.

In this embodiment, a field-sequential liquid crystal display device, which displays moving images with high quality, can be obtained by using the liquid crystal layer exhibiting a blue phase with a sufficiently short response time and further using the thin film transistor including the In—Ga—Zn—O-based oxide semiconductor as a switching element.

Note that the shape of the pixel electrode layer and the common electrode layer formed over the structure body reflects the shape of the structure body and is also influenced by an etching process. The shape of the top surface of the structure body and the pixel electrode formed over the structure body is not limited to that illustrated in FIG. 2A, and may be a variety of shapes.

Figure 3:
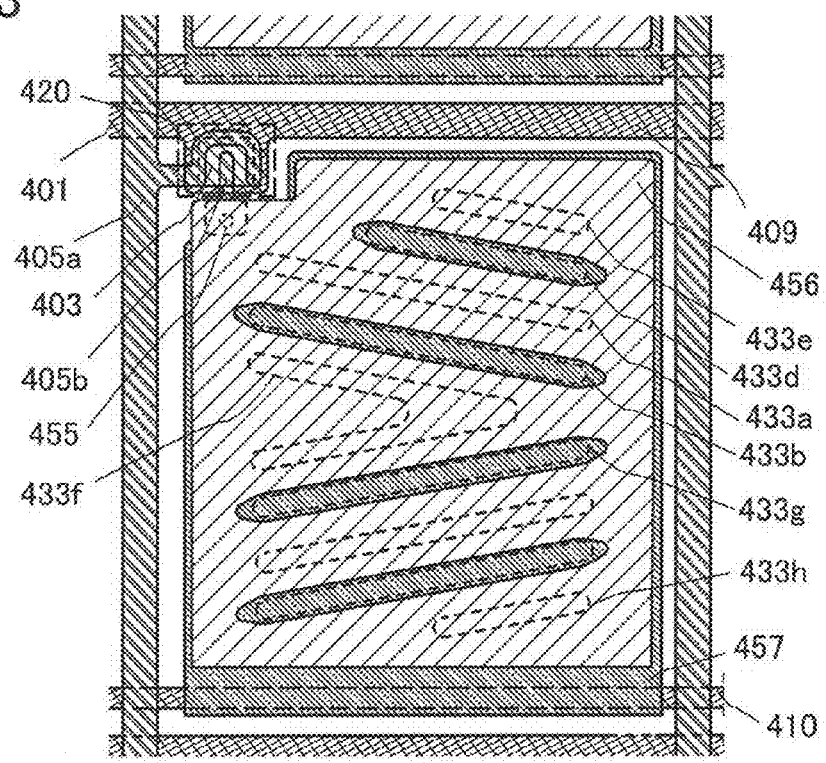
FIG. 3 is a top view of one embodiment of the present invention.

FIG. 3 illustrates another example of a plan view of a liquid crystal display device. Note that description will be made using the same reference numerals for the portions that are common to those in FIG. 2A.

In FIG. 3, the first structure body 433a, the second structure body 433b, the fourth structure body 433d, and the fifth structure body 433e have the same shape and arrangement as those in FIG. 2A. A sixth structure body 433f adjacent to the second structure body 433b has a V-shaped top surface. A seventh structure body 433g adjacent to the sixth structure body 433f has the same top shape as the first structure body 433a, but has a long-axis direction to the gate wiring layer which is different from that of the first structure body 433a. The long axis of the top surface of the eighth structure body 433h is in the same direction as, but shorter than that of the seventh structure body 433g. Furthermore, in accordance with these structure bodies, openings in the second electrode layer 456 have a shape different from that of the openings in the second electrode layer 446.

As described above, in FIG. 3, the sixth structure body 433f, the seventh structure body 433g, the eight structure body 433h, and the second electrode layer 456 allow increasing the viewing angle as compared to in FIG. 2A.

In FIG. 3, the top surface of the first electrode layer 457 is also different from that of the first electrode layer 447 in FIG. 2A. The top surface of the first electrode layer 457 does not overlap the wiring layer 405a, and is electrically connected to a first electrode layer in an adjacent pixel through a capacitor wiring 410. In a liquid crystal display device having a large display area, it is preferable to use the capacitor wiring 410 made of a metal wiring with a lower resistance than the first electrode layer in order to reduce the wiring resistance.

In FIG. 3, electrical connection between the thin film transistor 420 and the second electrode layer 456 is made through a contact hole 455. Although not illustrated, the contact hole is formed in the insulating film 407 that is provided over the structure bodies and the first electrode layer 457. In that case, the first electrode layer 457 is insulated from the second electrode layer 456 by a stack of the insulating layer 402 and the insulating film 407.

As illustrated in FIG. 3, the structure bodies, the first electrode layer, and the second electrode layer can have a variety of shapes.

(Embodiment 3)

In Embodiment 1, the calculation was performed with a voltage applied to the first electrode layer set to 0 V and a voltage applied to the second electrode layer set to 10 V. In this embodiment, calculation is performed with a voltage applied to the first electrode layer set to 10 V and a voltage applied to the second electrode layer set to 0 V in FIG. 9A. The result of calculating the electric field applied in the liquid crystal display device is shown in FIG. 9B.

Figure 9A:
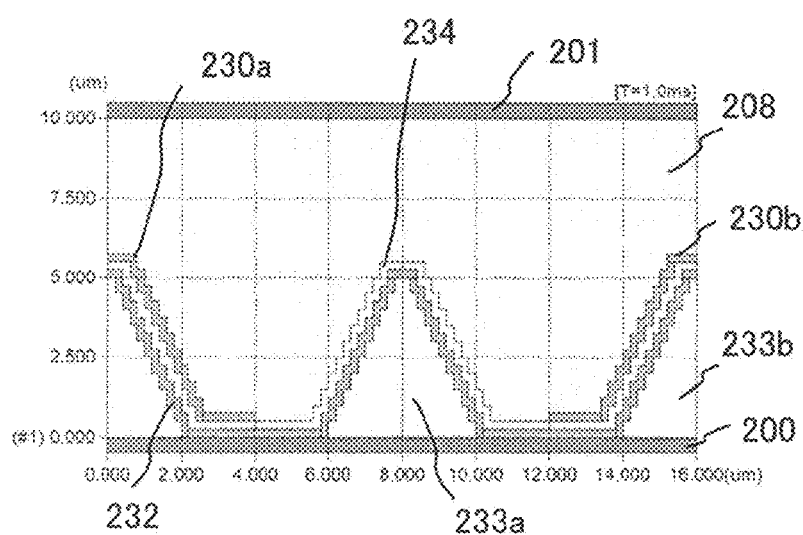
FIGS. 9A and 9B are graphs showing the result of calculating an electric field mode in a liquid crystal display device.
Figure 9B:
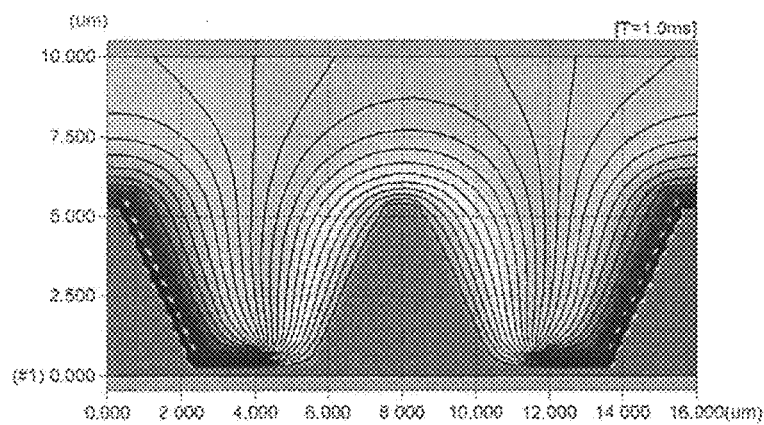

In FIG. 9B, a solid line represents an equipotential line marked at intervals of 0.5 V, and the arrangement of the pixel electrode and the common electrode corresponds to that illustrated in FIG. 9A.

Since an electric field is applied perpendicularly to the equipotential line, it is found that a horizontal electric field is applied between the first pixel electrode layer and the second electrode layer as illustrated in FIG. 9B.

FIG. 9A is identical to FIG. 6A; therefore, description of FIG. 9A is omitted.

In the case where the electric field illustrated in FIG. 9B is applied in an active matrix liquid crystal display device, the second electrode layer is electrically connected to a thin film transistor.

Figure 4:
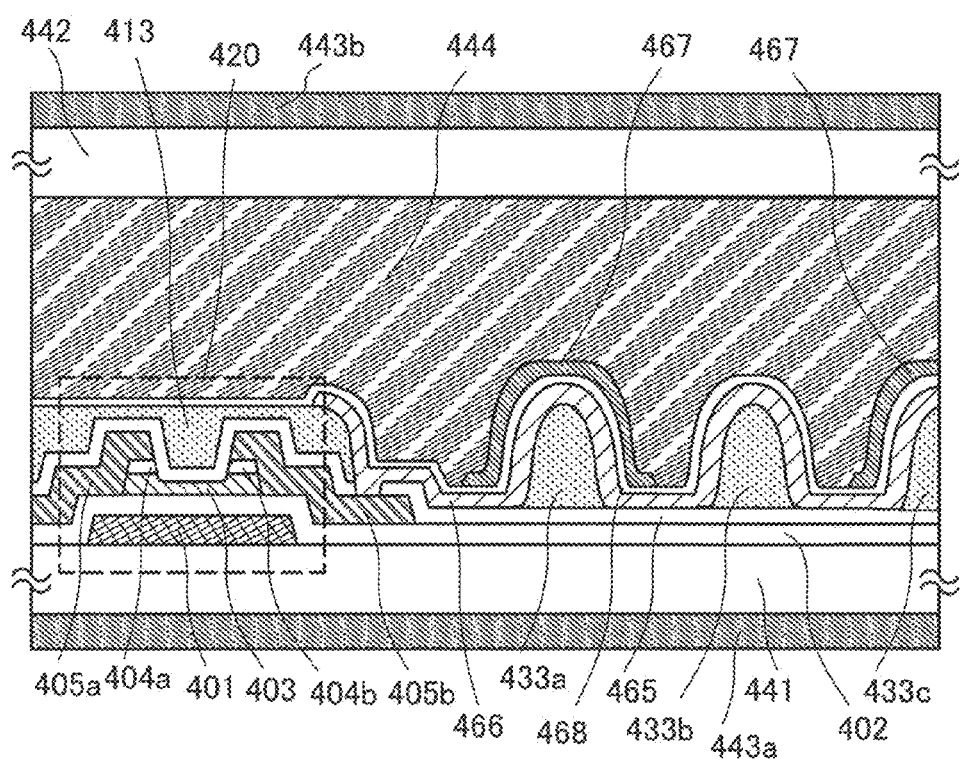
FIG. 4 is a cross-sectional view of one embodiment of the present invention.

An example of the cross-sectional structure in that case will be illustrated in FIG. 4. Note that description will be made using the same reference numerals for the portions that are common to those in FIG. 2B.

The thin film transistor 420 has the same structure as that in FIG. 2B. The first structure body 433a, the second structure body 433b, and the third structure body 433c are formed over a second insulating layer 465 that is in contact with the semiconductor layer 403 of the thin film transistor 420. In the same process as these structure bodies, an interlayer insulating film 413 is formed to overlap the thin film transistor 420.

A second electrode layer 466 is formed to cover the first structure body 433a, the second structure body 433b, and the third structure body 433c. The second electrode layer 466 is electrically connected to the wiring layer 405b of the thin film transistor 420 through a contact hole formed in the second insulating layer 465.

A third insulating layer 468 is formed to cover the second electrode layer 466. This third insulating layer 468 corresponds to the insulating film 407 in FIG. 2B.

A first electrode layer 467 is arranged over the third insulating layer 468 to overlap the first structure body 433a and the third structure body 433c. Note that the first electrode layer 467 has a fixed potential and includes a plurality of openings (slits).

In this embodiment, a part of the pixel electrode which is provided on an inclined surface of the interlayer insulating film 413 also allows an electric field in a direction parallel to the plane surface of the first substrate 441 to be formed in the liquid crystal layer 444. An electric field is formed between the part of the pixel electrode which is provided on the inclined surface of the interlayer insulating film 413 and a part of the first electrode layer 467 which is provided on an inclined surface of the first structure body 433a.

This embodiment shows an example in which the interlayer insulating film 413 and the plurality of structure bodies are formed in the same process in order to reduce the number of manufacturing steps; however, the present invention is not limited to this example and the plurality of structure bodies may be formed after the formation of the interlayer insulating film.

This embodiment can be freely combined with Embodiment 1 or Embodiment 2.

(Embodiment 4)

In this embodiment, a structure for applying a strong electric field to a liquid crystal layer will be described in which a third electrode layer is provided on the second substrate in addition to the structure of Embodiment 1.

Figure 5A:
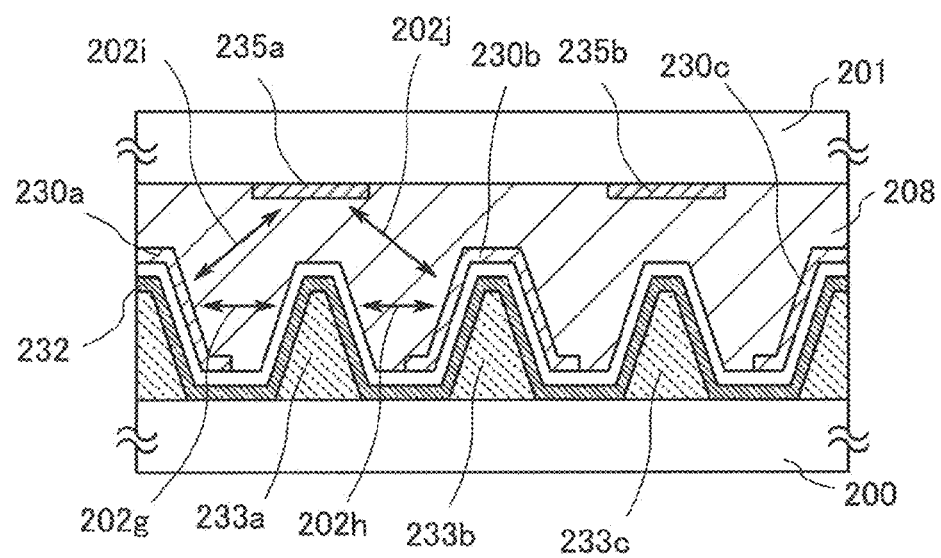
FIGS. 5A and 5B are cross-sectional views of one embodiment of the present invention.

FIG. 5A is a diagram illustrating an example of the positional relationship between a first electrode layer, a second electrode layer, and a third electrode layer in a liquid crystal display device. Note that description will be made using the same reference numerals for the portions that are common to those in FIG. 1A.

In FIG. 5A, structure bodies formed over the first substrate 200, the first electrode layer, and the second electrode layer are arranged in the same position as in FIG. 1A.

A third electrode 235a and a third electrode 235b which are formed on the second substrate 201 are provided over the structure body 233a and the structure body 233c, respectively.

For example, when a voltage is applied so that a potential difference is generated between the pixel electrode and the common electrode, a horizontal electric field indicated by an arrow 202g is applied between the second electrode layer 230a serving as the pixel electrode and the first electrode layer 232 serving as the common electrode. Furthermore, an oblique electric field indicated by an arrow 202i is applied between the second electrode layer 230a and the third electrode layer 235a serving as the common electrode. The oblique electric field indicated by the arrow 202i allows the response of liquid crystal molecules to be made in the entire liquid crystal layer including the thickness direction.

In addition, a horizontal electric field indicated by an arrow 202h is applied between the second electrode layer 230b and the first electrode layer 232. Furthermore, an oblique electric field indicated by an arrow 202j is applied between the second electrode layer 230b and the third electrode layer 235a serving as the common electrode. The oblique electric field indicated by the arrow 202j allows the response of liquid crystal molecules to be made in the entire liquid crystal layer including the thickness direction.

Figure 10A:
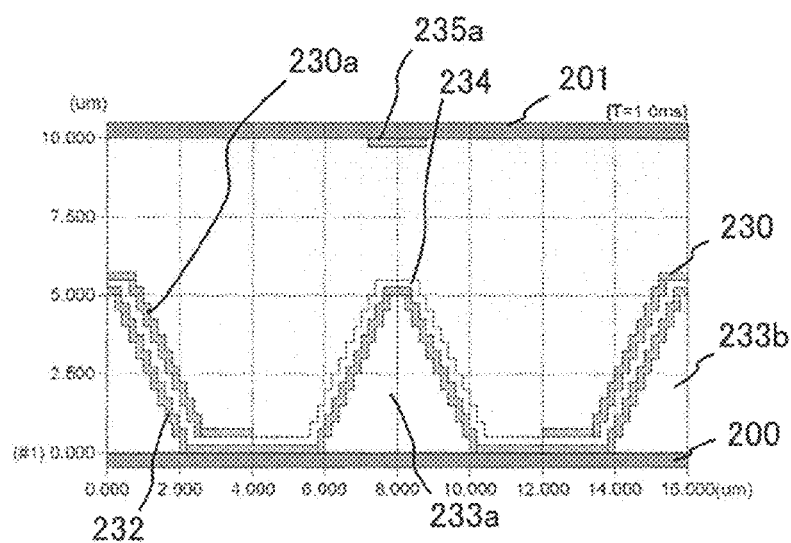
FIGS. 10A and 10B are graphs showing the result of calculating an electric field mode in a liquid crystal display device.
Figure 10B:
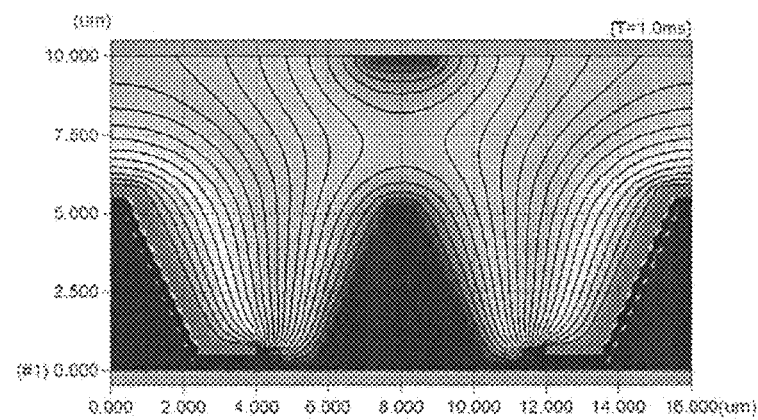

FIG. 10B shows the result of calculating the electric field applied in the liquid crystal display device including the third electrode layer 235a. FIG. 10A is a diagram illustrating the structure of the liquid crystal display device used for calculation.

The cross section of the third electrode layer 235a serving as the common electrode has a width of 1.60 μm and a thickness of 0.25 μm. Note that a voltage applied to the first electrode layer 232 serving as the common electrode and a voltage applied to the third electrode layer 235a are set to 0 V, and a voltage applied to the second electrode layer serving as the pixel electrode is set to 10 V.

FIG. 5A illustrates an example in which the second electrode layer 230a serves as the pixel electrode and the first electrode layer 232 serves as the common electrode. On the other hand, FIG. 5B illustrates an example in which the second electrode layer 230a serves as the common electrode and the first electrode layer 232 serves as the pixel electrode.

Figure 5B:
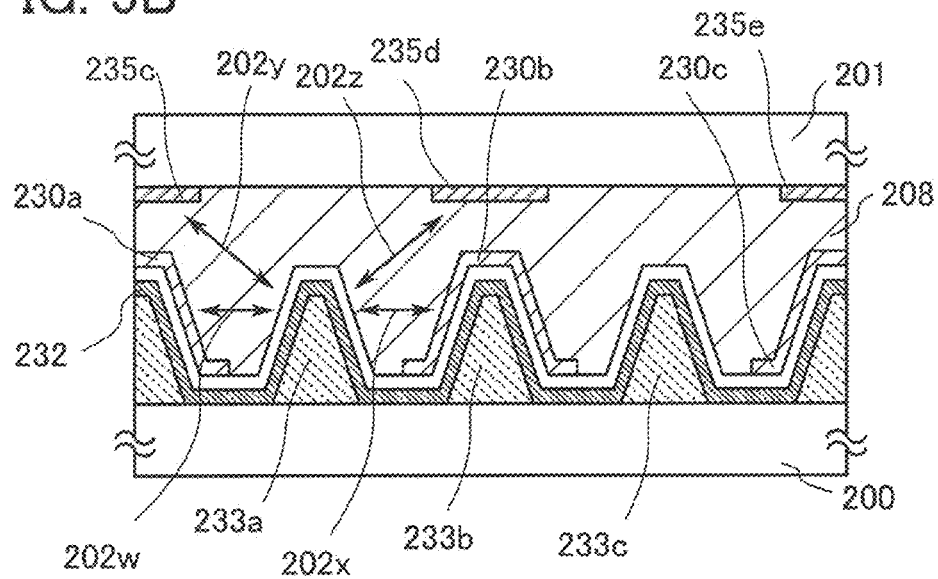

In the case of FIG. 5B, a third electrode layer 235c, a third electrode layer 235d, a third electrode layer 235e which are formed on the second substrate 201 are respectively provided over the second electrode layer 230a, the second electrode layer 230b, and the second electrode layer 230c serving as the common electrodes.

For example, when a voltage is applied so that a potential difference is generated between the pixel electrode and the common electrode, in FIG. 5B, a horizontal electric field indicated by an arrow 202w is applied between the second electrode layer 230a serving as the common electrode and the first electrode layer 232 serving as the pixel electrode. Furthermore, an oblique electric field indicated by an arrow 202y is applied between the first electrode layer 232 and the third electrode layer 235c serving as the common electrode. The oblique electric field indicated by the arrow 202y allows the response of liquid crystal molecules to be made in the entire liquid crystal layer including the thickness direction.

In addition, a horizontal electric field indicated by an arrow 202x is applied between the second electrode layer 230b and the first electrode layer 232. Furthermore, an oblique electric field indicated by an arrow 202z is applied between the first electrode layer 232 and the third electrode layer 235d serving as the common electrode. The oblique electric field indicated by the arrow 202z allows the response of liquid crystal molecules to be made in the entire liquid crystal layer including the thickness direction.

Figure 11A:
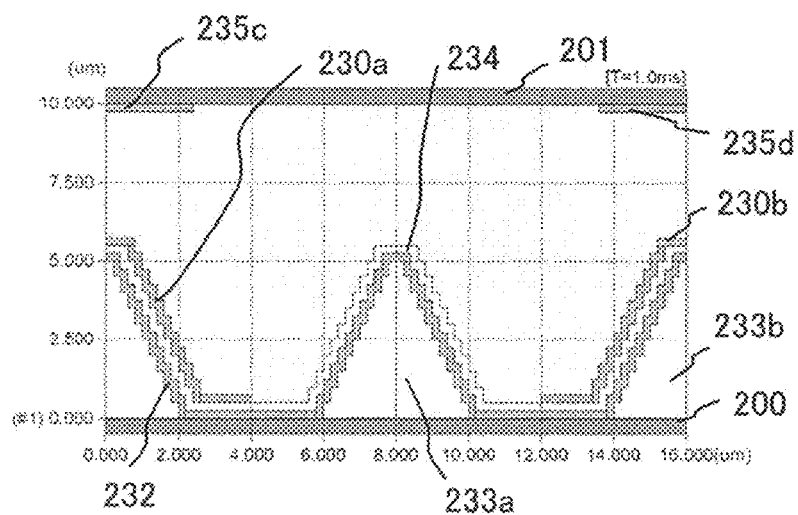
FIGS. 11A and 11B are graphs showing the result of calculating an electric field mode in a liquid crystal display device.
Figure 11B:
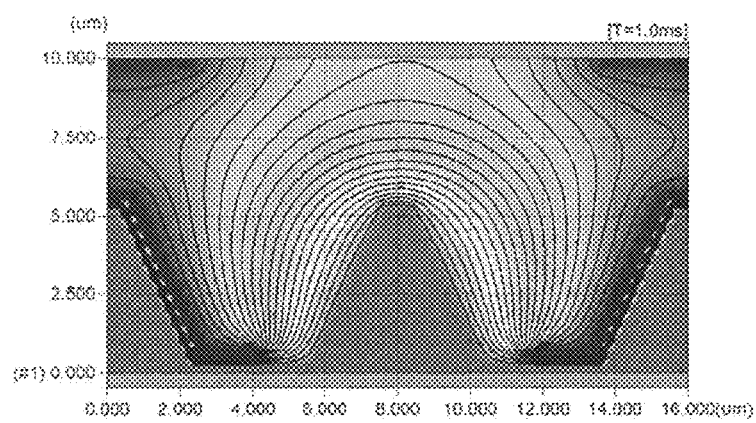

FIG. 11B shows the result of calculating the electric field applied in the liquid crystal display device including the third electrode layers 235c and 235d. FIG. 11A is a diagram illustrating the structure of the liquid crystal display device used for calculation. Note that a voltage applied to the second electrode layers 230a and 230b serving as the common electrodes and a voltage applied to the third electrode layers 235c and 235d are set to 0 V, and a voltage applied to the first electrode layer 232 serving as the pixel electrode is set to 10 V.

The cross section of each of the third electrode layers 235c and 235d has a width of 2.40 µm and a thickness of 0.25 µm.

This embodiment can be freely combined with Embodiment 1, Embodiment 2, or Embodiment 3.

(Embodiment 5)

Figure 12A:
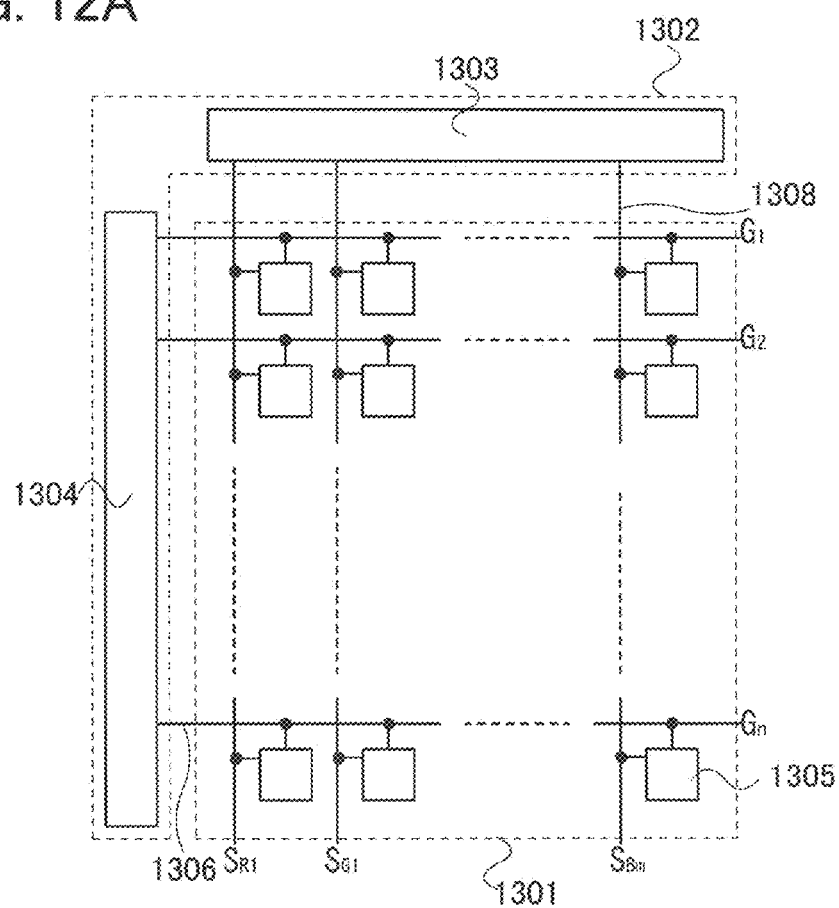
FIGS. 12A and 12B are block diagrams of a display device.
Figure 12B:
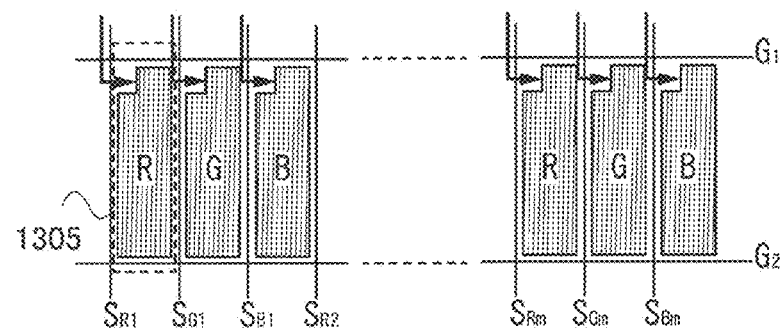

In this embodiment, a block diagram of a liquid crystal display device is illustrated in FIGS. 12A and 12B. FIG. 12A illustrates a structure of a display portion 1301 and a driving portion 1302. The driving portion 1302 includes a signal line driver circuit 1303, a scan line driver circuit 1304, and the like. In the display portion 1301, a plurality of pixels 1305 are provided in a matrix.

In FIG. 12A, a scan signal is supplied from the scan line driver circuit 1304 to a scan line 1306, and data is supplied from the signal line driver circuit 1303 to a signal line 1308. A scan signal is supplied from the scan line 1306 so that the pixels 1305 are selected in order from the first row of the scan line 1306.

In FIG. 12A, the scan line driver circuit 1304 is connected to n scan lines 1306 $G_1$ to $G_n$. Considering the case where the minimum image unit is composed of three pixels of R (red), G (green), and B (blue), the signal line driver circuit 1303 is connected to 3 m signal lines in total: m signal lines $S_{R1}$ to $S_{Rm}$ corresponding to R; m signal lines $S_{G1}$ to $S_{Gm}$ corresponding to G, and m signal lines $S_{B1}$ to $S_{Bm}$ corresponding to B. That is, as illustrated in FIG. 12B, each color element is provided with a signal line and data is supplied from the signal line to the pixel corresponding to each color element, so that the pixels 1305 can express a desired color.

Figure 13:
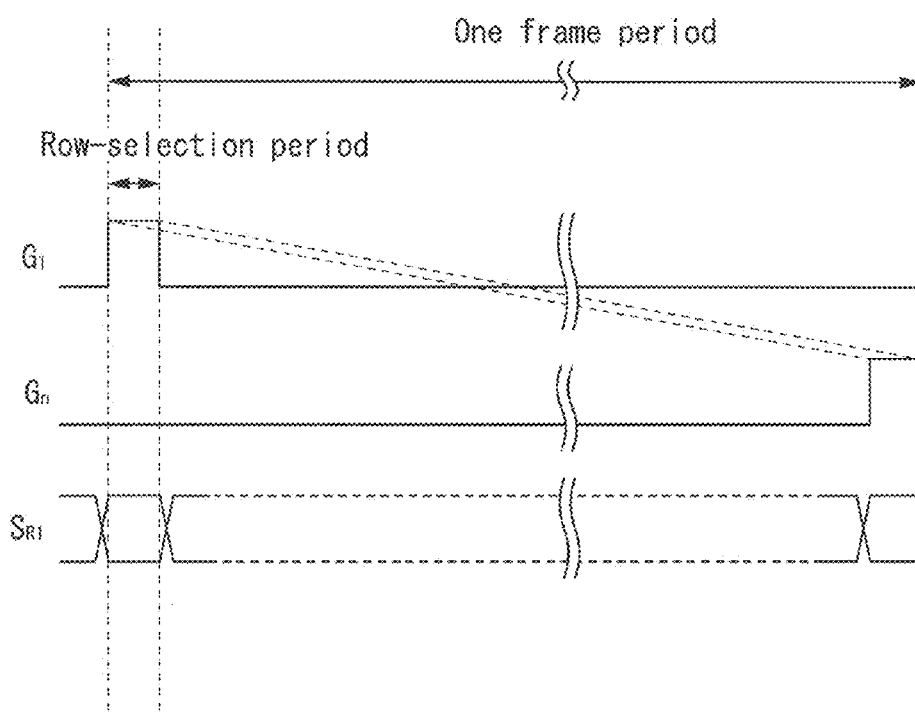
FIG. 13 is a timing chart.

A timing chart of FIG. 13 shows scan signals for selecting the scan lines 1306 (e.g., G1 and Gn) in the respective row-selection periods (scan period of one row of pixels of the display device) in one frame period, and a data signal of the signal line 1308 (e.g., SR1).

Note that the circuit diagram of FIG. 12A is based on the assumption that an n-channel transistor is included in each pixel. Also in FIG. 13, description is made on the driving of a pixel in the ease of controlling on or off of an n-channel transistor. If a p-channel transistor is used in the circuit diagram of FIG. 12A, the potential of the scan signal only needs to be changed so that the transistor can be turned on or off in a manner similar to that in the case of using an n-channel transistor.

In the timing chart of FIG. 13, a row-selection period is 1/(120×n) second on the assumption that one frame period during which an image of one screen is displayed is set to at least 1/120 second (≈8.3 ms) (more preferably, 1/240 second) and the number of scan lines is set to n so that an afterimage is not visible to an observer. In the case of a display device including 2000 scan lines (considering so-called 4k2k images with 4096×2160 pixels, 3840×2160 pixels, or the like), a row-selection period is 1/240000 second (≈4.2 µs) if signal delay or the like due to a wiring is not taken into consideration.

A blue-phase liquid crystal element has a response time (a time to change the alignment of a liquid crystal molecule) of 1 ms or less when a voltage is applied. On the other hand, a VA mode liquid crystal element has a response time of about a few milliseconds when a voltage is applied, even if the overdrive method is employed. Accordingly, in the operation of a VA mode liquid crystal element, the length of one frame period needs to be longer than the response time in order to maintain high image quality. In the display device of this embodiment, a blue-phase liquid crystal element is used and a wiring is made of a low-resistant material such as Cu so as to reduce signal delay due to the wiring, a wide margin of response time of the liquid crystal element can be provided, and a desired alignment of the liquid crystal element which is based on a voltage applied to the liquid crystal element in a row-selection period can be efficiently obtained.

This embodiment can be freely combined with Embodiment 1, Embodiment 2, Embodiment 3, or Embodiment 4.

(Embodiment 6)

Another example of a thin film transistor that can be applied to the liquid crystal display device of Embodiments 1 to 4 will be described. In particular, description will be made on an example of the structure of a thin film transistor and the semiconductor material used for a semiconductor layer. Components in common with those in Embodiments 1 to 4 can be formed using a similar material and manufacturing method, and detailed description of the same portions or portions having similar functions is omitted.

Figure 14:
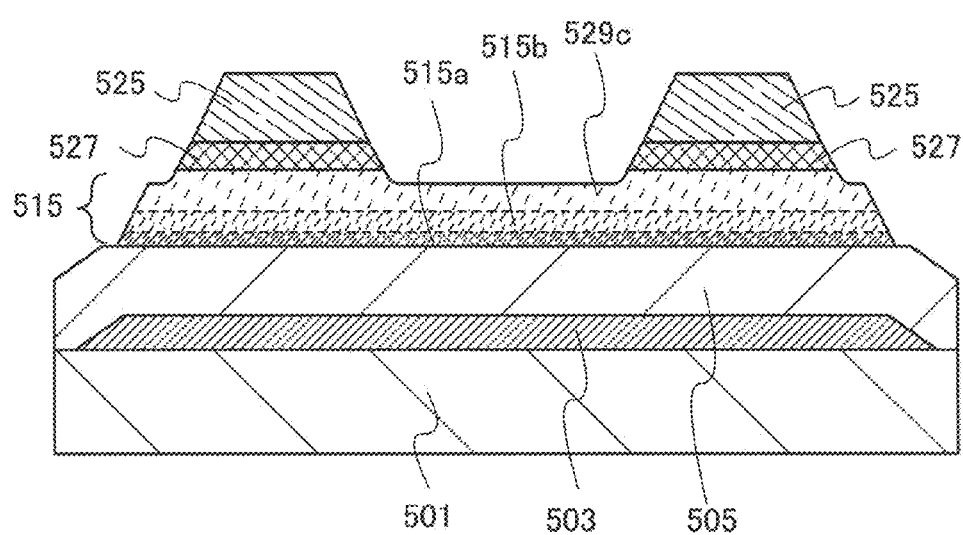
FIG. 14 is a cross-sectional view of a thin film transistor.

FIG. 14 is a cross-sectional view of one mode of the thin film transistor shown in this embodiment. The thin film transistor illustrated in FIG. 14 includes a gate electrode layer 503 over a substrate 501, a semiconductor layer 515 over a gate insulating layer 505, impurity semiconductor layers 527 serving as source and drain regions which are in contact with the upper surface of the semiconductor layer 515, and wirings 525 in contact with the impurity semiconductor layers 527. The semiconductor layer 515 includes a microcrystalline semiconductor layer 515a, a mixed region 515b, and a layer 529c containing an amorphous semiconductor, which are stacked in order over the gate insulating layer 505.

Figure 15A:
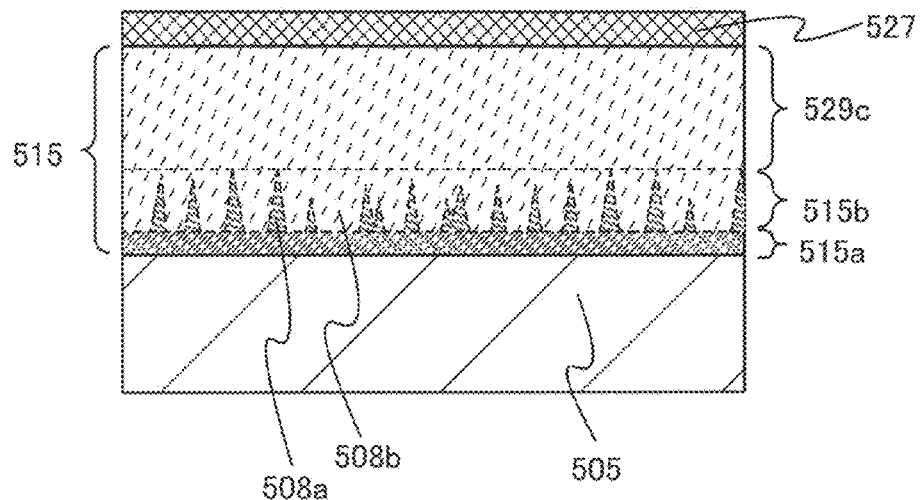
FIGS. 15A and 15B are cross-sectional views of a semiconductor layer.
Figure 15B:
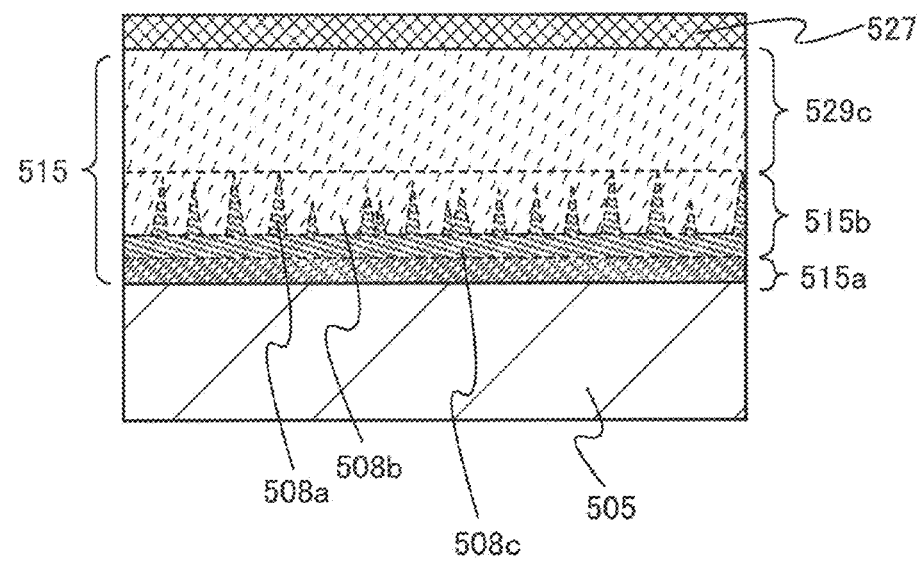

Next, a structure of the semiconductor layer 515 will be described. FIGS. 15A and 15B are enlarged views of the area between the gate insulating layer 505 and the impurity semiconductor layers 527 serving as source and drain regions.

FIGS. 15A and 15B illustrate one mode of the semiconductor layer 515. As illustrated in FIG. 15A, in the semiconductor layer 515, the microcrystalline semiconductor layer 515a, the mixed region 515b, and the layer 529c containing an amorphous semiconductor are stacked.

A microcrystalline semiconductor included in the microcrystalline semiconductor layer 515a is a semiconductor having a crystal structure (including a single crystal and a polycrystal). The microcrystalline semiconductor is a semiconductor in a third state that is stable in terms of free energy, and is a crystalline semiconductor having short-range order and lattice distortion. The microcrystalline semiconductor includes columnar or needle-like crystals with a grain size of 2 nm to 200 nm, preferably 10 nm to 80 nm, and more preferably 20 nm to 50 nm, which grow in the direction of the normal to the surface of the substrate. Therefore, a crystal grain boundary is formed at the interface of the columnar or needle-like crystals in some cases.

The Raman spectrum of microcrystalline silicon, which is a typical example of a microcrystalline semiconductor, has a peak shifted to a lower wavenumber side than 520 cm$^{-1}$ that represents single crystal silicon. In other words, the Raman spectrum of microcrystalline silicon has a peak between 520 cm$^{-1}$ that represents single crystal silicon and 480 cm$^{-1}$ that represents amorphous silicon. Furthermore, the microcrystalline semiconductor may contain 1 atomic % or more of hydrogen or halogen to terminate dangling bonds. The microcrystalline semiconductor may further contain a rare gas element such as helium, argon, krypton, or neon to further promote lattice distortion, whereby the stability of the microcrystalline structure is improved and a favorable microcrystalline semiconductor can be obtained. Such a microcrystalline semiconductor is disclosed in, for example, U.S. Pat. No. 4,409,134.

In order to improve the crystallinity of the microcrystalline semiconductor layer 515a, the concentrations of oxygen and nitrogen contained in the microcrystalline semiconductor layer 515a which are measured by secondary ion mass spectrometry are preferably set to less than 1×10$^{18}$ atoms/cm$^3$.

The microcrystalline semiconductor layer 515a preferably has a thickness of 3 nm to 100 nm, more preferably 5 nm to 50 nm.

Although the microcrystalline semiconductor layer 515a is formed as a layer in FIG. 14 and FIGS. 15A and 15B, microcrystalline semiconductor particles may be dispersed on the gate insulating layer 505 instead. In that case, the mixed region 515b is in contact with the microcrystalline semiconductor particles and the gate insulating layer 505.

When the microcrystalline semiconductor particles have a size of 1 nm to 30 nm, and a density of less than 1×10$^{13}$/cm$^2$, preferably 1×10$^{10}$/cm$^2$, the microcrystalline semiconductor particles can be separated from each other.

The mixed region 515b and the layer 529c containing an amorphous semiconductor contain nitrogen. The concentration of nitrogen contained in the mixed region 515b is 1×10$^{20}$ atoms/cm$^3$ to 1×10$^{21}$ atoms/cm$^3$, preferably 2×10$^{20}$ atoms/cm$^3$ to 1×10$^{21}$ atoms/cm$^3$.

As illustrated in FIG. 15A, the mixed region 515b includes microcrystalline semiconductor regions 508a and an amorphous semiconductor region 508b which fills the space between the microcrystalline semiconductor regions 508a. Specifically, the mixed region 515b includes the microcrystalline semiconductor regions 508a growing into a projecting shape from the surface of the microcrystalline semiconductor layer 515a, and the amorphous semiconductor region 508b made of the same kind of semiconductor as the layer 529c containing an amorphous semiconductor.

The microcrystalline semiconductor regions 508a are made of a microcrystalline semiconductor with a projecting, needle-like, conical, or pyramidal shape which is tapered from the gate insulating layer 505 toward the layer 529c containing an amorphous semiconductor. Note that the microcrystalline semiconductor regions 508a may be made of a microcrystalline semiconductor with a projecting, conical, or pyramidal shape which is tapered from the layer 529c containing an amorphous semiconductor toward the gate insulating layer 505.

In some cases, the amorphous semiconductor region 508b in the mixed region 515b includes a semiconductor crystal grain with a size of 1 nm to 10 nm, preferably 1 nm to 5 nm as a microcrystalline semiconductor region.

Alternatively, as illustrated in FIG. 15B, a microcrystalline semiconductor region 508c with a uniform thickness which is deposited over the microcrystalline semiconductor layer 515a, and the microcrystalline semiconductor region 508a with a projecting, needle-like, conical, or pyramidal shape which is tapered from the gate insulating layer 505 toward the layer 529c containing an amorphous semiconductor are successively formed in the mixed region 515b.

The amorphous semiconductor region 508b included in the mixed region 515b illustrated in FIGS. 15A and 15B is made of a semiconductor having substantially the same quality as that in the layer 529c containing an amorphous semiconductor.

Accordingly, it is said that the interface between a region including a microcrystalline semiconductor and a region including an amorphous semiconductor corresponds to the interface between the microcrystalline semiconductor region 508a and the amorphous semiconductor region 508b in the mixed region; thus, a cross-sectional boundary between the microcrystalline semiconductor region and the amorphous semiconductor region can be described as uneven or zigzag.

In the mixed region 515b, in the case where the microcrystalline semiconductor region 508a includes a semiconductor crystal grain with a projecting shape which is tapered from the gate insulating layer 505 toward the layer 529c containing an amorphous semiconductor, the proportion of the microcrystalline semiconductor region is higher in a region closer to the microcrystalline semiconductor layer 515a than in a region closer to the layer 529c containing an amorphous semiconductor. The reason for this is as follows. The microcrystalline semiconductor region 508a grows in the thickness direction from the surface of the microcrystalline semiconductor layer 515a. By adding a gas containing nitrogen to a source gas, or by adding a gas containing nitrogen to a source gas and reducing the flow rate of hydrogen to silane from that under the condition for depositing the microcrystalline semiconductor layer 515a, growth of the semiconductor crystal grain in the microcrystalline semiconductor region 508a is suppressed to form a conical or pyramidal microcrystalline semiconductor region, and the amorphous semiconductor is gradually deposited thereover. This is caused by the fact that the solid solubility of nitrogen in the microcrystalline semiconductor region is lower than that in the amorphous semiconductor region.

The total thickness of the microcrystalline semiconductor layer 515a and the mixed region 515b, that is, the distance from the interface between the microcrystalline semiconductor layer 515a and the gate insulating layer 505 to the tip of the projection (projecting portion) in the mixed region 515b is set to 3 nm to 410 nm, preferably 20 nm to 100 nm, so that the off-current of the thin film transistor can be reduced.

The layer 529c containing an amorphous semiconductor is made of a semiconductor having substantially the same quality as that in the amorphous semiconductor region 508b included in the mixed region 515b, and contains nitrogen. In some cases, the layer 529c containing an amorphous semiconductor includes a semiconductor crystal grain with a size of 1 nm to 10 nm, preferably 1 nm to 5 nm. Here, the layer 529c containing an amorphous semiconductor means a semiconductor layer having low energy at an Urbach edge and a narrow spectrum of defect absorption, which are measured by a constant photocurrent method (CPM) or photoluminescence spectroscopy, compared to a conventional amorphous semiconductor layer. In other words, the layer 529c containing an amorphous semiconductor is a well-ordered semiconductor layer which has fewer defects and a steep tail slope of a level at a band edge in the valence band compared to the conventional amorphous semiconductor layer. Since the layer 529c containing an amorphous semiconductor has a steep tail slope of a level at a band edge in the valence band, the band gap increases, and tunneling current does not easily flow. Therefore, the layer 529c containing an amorphous semiconductor provided on the back channel side allows reducing the off-current of the thin film transistor. In addition, the layer 529c containing an amorphous semiconductor allows increasing the on-current and field-effect mobility of the thin film transistor.

The spectrum of the layer 529c containing an amorphous semiconductor, which is measured using low-temperature photoluminescence spectroscopy, has a peak in the range of 1.31 eV to 1.39 eV. Note that the spectrum of a microcrystalline semiconductor layer, typically a microcrystalline silicon layer, which is measured using low-temperature photoluminescence spectroscopy, has a peak in the range of 0.98 eV to 1.02 eV, which means that the layer 529c containing an amorphous semiconductor is different from the microcrystalline semiconductor layer.

Amorphous silicon is a typical example of an amorphous semiconductor in the layer 529c containing an amorphous semiconductor.

It is preferable that the mixed region 515b and the layer 529c containing an amorphous semiconductor each have a thickness of 50 nm to 350 nm, more preferably 120 nm to 250 nm.

Since the mixed region 515b includes the conical or pyramidal microcrystalline semiconductor region 508a, the resistance in the vertical direction (the thickness direction) in applying voltage to a source or drain electrode, that is, the resistance of the microcrystalline semiconductor layer 515a, the mixed region 515b, and the layer 529c containing an amorphous semiconductor can be reduced.

The mixed region 515b preferably has an NH group or an $NH_2$ group. This is because the NH group or the $NH_2$ group is bonded to a dangling bond of a silicon atom at the interface between different microcrystalline semiconductor regions included in the microcrystalline semiconductor region 508a, at the interface between the microcrystalline semiconductor region 508a and the amorphous semiconductor region 508b, or at the interface between the microcrystalline semiconductor layer 515a and the mixed region 515b, whereby defects are reduced.

Further, making the oxygen concentration lower than the nitrogen concentration in the mixed region 515b allows reducing bonds which interrupt carrier transfer at the interface between the microcrystalline semiconductor region 508a and the amorphous semiconductor region 508b and in defects at the interface between semiconductor crystal grains.

In this manner, the off-current of the thin film transistor can be reduced by forming a channel formation region using the microcrystalline semiconductor layer 515a, and by providing, between the channel formation region and the impurity semiconductor layers 527 serving as source and drain regions, the layer 529c containing an amorphous semiconductor, which is a well-ordered semiconductor layer having fewer defects and a steep tail slope of a level at a band edge in the valence band. In addition, the off-current of the thin film transistor can be reduced while the on-current and field-effect mobility thereof is increased by providing, between the channel formation region and the impurity semiconductor layers 527 serving as source and drain regions, the mixed region 515b including the conical or pyramidal microcrystalline semiconductor region 508a, and the layer 529c containing an amorphous semiconductor, which is a well-ordered semiconductor layer having fewer defects and a steep tail slope of a level at a band edge in the valence band.

The impurity semiconductor layers 527 illustrated in FIG. 14 are formed of amorphous silicon to which phosphorus is added, microcrystalline silicon to which phosphorus is added, or the like. In the case where a p-channel thin film transistor is formed as the thin film transistor, the impurity semiconductor layers 527 are formed of microcrystalline silicon to which boron is added, amorphous silicon to which boron is added, or the like. Note that the impurity semiconductor layers 527 are not necessarily formed in the case where an ohmic contact is formed between the mixed region 515b or the layer 529c containing an amorphous semiconductor and the wirings 525.

The off-current of the thin film transistor illustrated in FIG. 14 and FIGS. 15A and 15B can be reduced while the on-current and field-effect mobility thereof is increased by forming the channel formation region using the microcrystalline semiconductor layer and providing the layer containing an amorphous semiconductor on the back channel side. Furthermore, since the channel formation region is formed using the microcrystalline semiconductor layer, the thin film transistor less deteriorates and has high reliability in electric characteristics.

This embodiment can be implemented in appropriate combination with the structures shown in the other embodiments.

(Embodiment 7)

The liquid crystal display device shown in any one of Embodiments 1 to 6 includes thin film transistors, and when the thin film transistors are used for a driver circuit and further a pixel portion, the liquid crystal display device can have a display function. In addition, when part or whole of the driver circuit is formed over the same substrate as the pixel portion with use of the thin film transistors, a system-on-panel can be obtained.

The liquid crystal display device includes a liquid crystal element (also referred to as a liquid crystal display element) as a display element.

Furthermore, the liquid crystal display device includes a panel in which the display element is sealed, and a module in which an IC or the like including a controller is mounted on the panel. An embodiment of the present invention also relates to an element substrate, which corresponds to one mode before the display element is completed in a manufacturing process of the liquid crystal display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any other state.

Note that a liquid crystal display device in this specification refers to an image display device, a display device, or a light source (including a lighting device). Furthermore, the liquid crystal display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

The appearance and cross section of a liquid crystal display panel, which is one embodiment of the liquid crystal display device, will be described with reference to FIGS. 16A and 16B. FIGS. 16A and 16B are top views of a panel in which thin film transistors 4010 and 4011, and a liquid crystal element 4013 are sealed between a first substrate 4001 and a second substrate 4006 with a sealant 4005. FIG. 16B is a cross-sectional view taken along line M-N of FIGS. 16A1 and 16A2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006.

In FIG. 16A1, a signal line driver circuit 4003 that is formed using a single crystal semiconductor film or a polycrystalline semiconductor film over a substrate separately prepared is mounted in a region different from the region surrounded by the sealant 4005 over the first substrate 4001. FIG. 16A2 illustrates an example in which part of a signal line driver circuit is formed over the first substrate 4001 with use of a thin film transistor. A signal line driver circuit 4003b is formed over the first substrate 4001 and a signal line driver circuit 4003a that is formed using a single crystal semiconductor film or a polycrystalline semiconductor film is mounted on a substrate separately prepared.

Note that there is no particular limitation on the connection method of a driver circuit which is separately formed, and COG, wire bonding, TAB, or the like can be used. FIG. 16A1 illustrates an example of mounting the signal line driver circuit 4003 by COG, and FIG. 16A2 illustrates an example of mounting the signal line driver circuit 4003 by TAB.

In FIGS. 16A1, 16A2, and 16B, a connecting terminal electrode 4015 is formed using the same conductive film as that for the pixel electrode layer 4030, and a terminal electrode 4016 is formed using the same conductive film as that for source and drain electrode layers of the thin film transistors 4010 and 4011. The connecting terminal electrode 4015 is electrically connected to a terminal included in the FPC 4018 through an anisotropic conductive film 4019.

The pixel portion 4002 and the scanning line driver circuit 4004 provided over the first substrate 4001 each include a plurality of thin film transistors. FIG. 16B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

The thin film transistor shown in Embodiment 3 is used as the thin film transistors 4010 and 4011. Alternatively, the thin film transistor shown in Embodiment 6, which includes a microcrystalline semiconductor layer as the semiconductor layer, may be used as the thin film transistors 4010 and 4011. The thin film transistors 4010 and 4011 are n-channel thin film transistors.

The pixel electrode layer 4030 and a common electrode layer 4031 are provided over the first substrate 4001.

As in Embodiment 3, a plurality of structure bodies are formed in the same process as the insulating layer 4021. The pixel electrode layer 4030 is formed on an inclined surface of a first structure body 4022, and an insulating layer 4023 and the common electrode layer 4031 are stacked thereover. Further, the pixel electrode layer 4030 and the insulating layer 4023 are stacked over a second structure body 4024 adjacent to the first structure body 4022.

The pixel electrode layer 4030 is electrically connected to the thin film transistor 4010 through a contact hole formed in the insulating layer 4020. A liquid crystal element 4013 includes the common electrode layer 4031 provided on the inclined surface of the first structure body 4022, the pixel electrode layer 4030 provided on the inclined surface of the second structure body 4024, and a liquid crystal layer 4008 interposed therebetween.

A polarizing plate 4032 and a polarizing plate 4033 are provided on the outside of the first substrate 4001 and the second substrate 4006, respectively.

The first substrate 4001 and the second substrate 4006 may be made of glass, plastic, or the like having light-transmitting properties. A plastic substrate may be a fiberglass-reinforced plastics (FRP) plate, a polyvinyl fluoride (PVF) film, a polyester film, or an acrylic resin film. Alternatively, a sheet with a structure in which an aluminum foil is sandwiched between PVF films or polyester films can be used.

Reference numeral 4035 denotes a columnar spacer obtained by selectively etching an insulating film and is provided to control the thickness of the liquid crystal layer 4008 (a cell gap). Alternatively, a spherical spacer may be used. In the liquid crystal display device using the liquid crystal layer 4008, the liquid crystal layer 4008 preferably has a thickness (a cell gap) of about 5 μm to 20 μm.

Although FIGS. 16A and 16B illustrate examples of a transmissive liquid crystal display device, an embodiment of the present invention can also be applied to a transflective liquid crystal display device.

FIGS. 16A and 16B illustrate an example of the liquid crystal display device in which the polarizing plate is provided on the outside of the substrate (on the viewer side); however, the polarizing plate may be provided on the inside of the substrate. The polarizing plate may be provided inside or outside the substrate as appropriate depending on materials of the polarizing plate or conditions of manufacturing steps. Furthermore, a light-shielding layer serving as a black matrix may be provided.

The insulating layer 4021 is a resin layer. In FIGS. 16A and 16B, a light-shielding layer 4034 is provided on the second substrate 4006 side so as to cover the thin film transistors 4010 and 4011. The light-shielding layer 4034 allows improving the contrast and stabilization of the thin film transistors.

Figure 17:
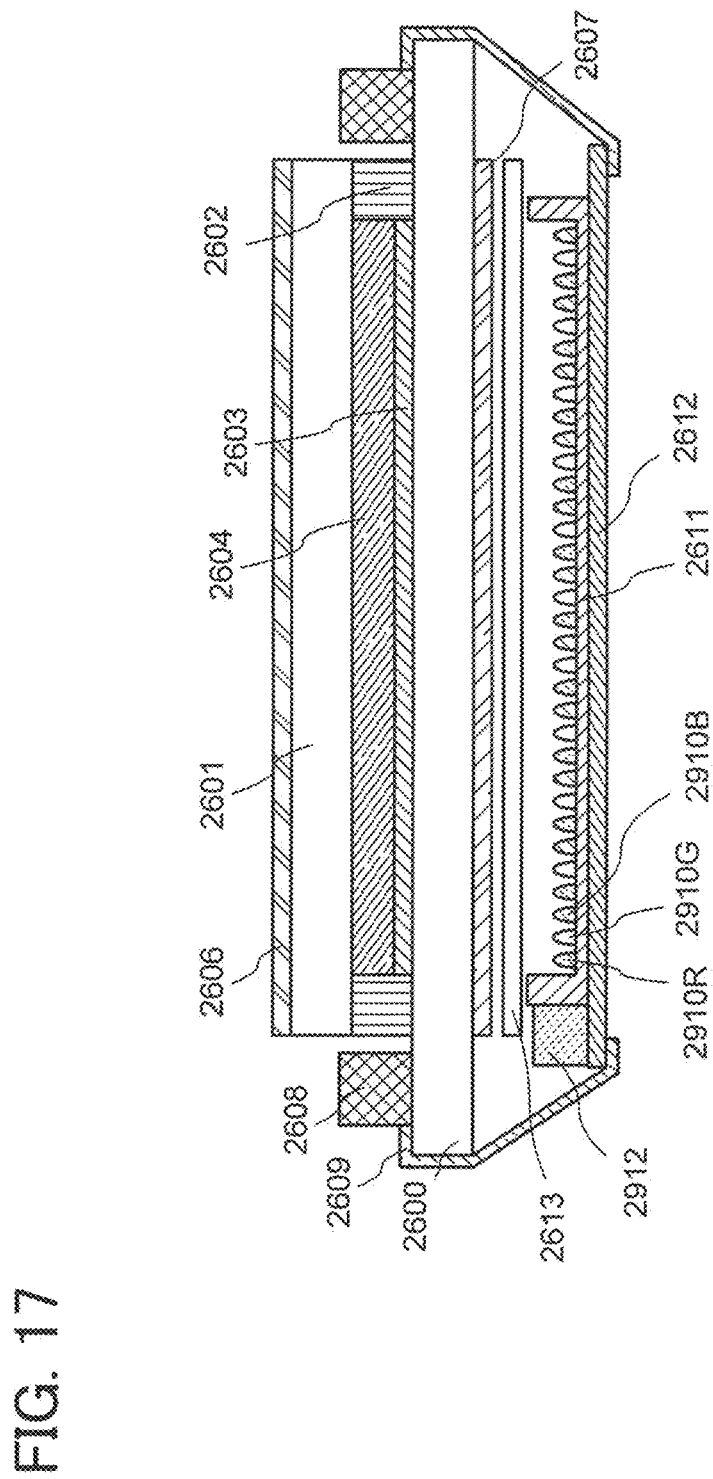
FIG. 17 is a cross-sectional view of a liquid crystal display device.

FIG. 17 illustrates an example of a cross-sectional structure of a liquid crystal display device, in which an element substrate 2600 and a counter substrate 2601 are bonded to each other with a sealant 2602, and an element layer 2603 including a TFT or the like and a liquid crystal layer 2604 are provided between the substrates.

In the case of performing color display, light-emitting diodes which emit light of plural colors are disposed in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outside of the counter substrate 2601, and a polarizing plate 2607 and an optical sheet 2613 are provided on the outside of the element substrate 2600. A light source includes the red light-emitting diode 2910R, the green light-emitting diode 2910G, the blue light-emitting diode 2910B, and a reflective plate 2611. An LED control circuit 2912 provided for a circuit substrate 2612 is connected to a wiring circuit portion 2608 of the element substrate 2600 through a flexible wiring board 2609 and further includes an external circuit such as a control circuit or a power source circuit.

This embodiment shows an example of a field-sequential liquid crystal display device in which the LEDs are individually made to emit light by this LED control circuit 2912; however, the present invention is not particularly limited to this example. A cold cathode fluorescent lamp or a white LED may be used as a light source of the backlight and a color filter may be provided.

This embodiment can be implemented in appropriate combination with the structures shown in the other embodiments.

(Embodiment 8)

A liquid crystal display device manufactured in any of the steps shown in Embodiments 1 to 6 can be applied to a variety of electronic appliances (including an amusement machine). Examples of electronic appliances include a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, and a large-sized game machine such as a pachinko machine.

Figure 18A:
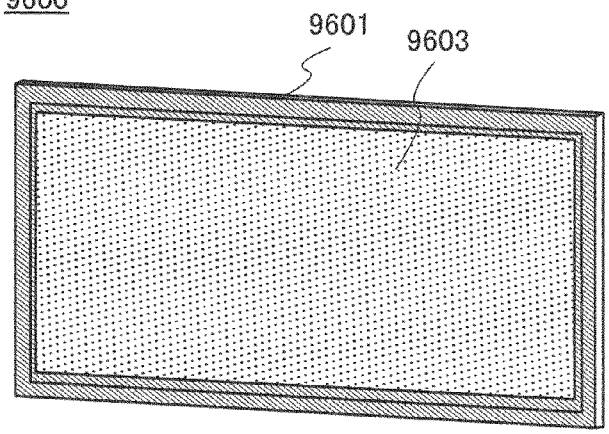
FIGS. 18A and 18B are perspective views of electronic appliances.

FIG. 18A illustrates an example of a television set 9600. In the television set 9600, a display portion 9603 is incorporated in a housing 9601. Images can be displayed on the display portion 9703. In FIG. 18A, the rear side of the housing is fixed to and supported by the wall.

The television set 9600 can be operated with an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying information output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 18B:
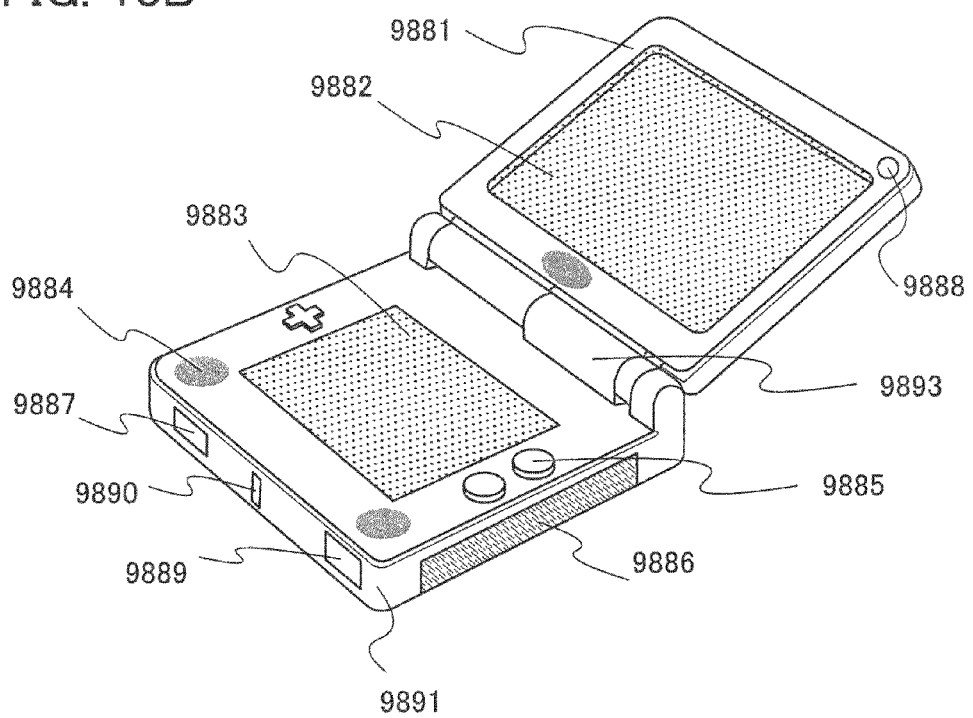

FIG. 18B is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 18B includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include other accessory equipment as appropriate. The portable amusement machine illustrated in FIG. 18B has a function of reading a program or data stored in a recording medium to display it on the display portion, and a function of sharing information with another portable amusement machine by wireless communication. The portable amusement machine illustrated in FIG. 18B can have various functions without limitation to the above.

Figure 19A:
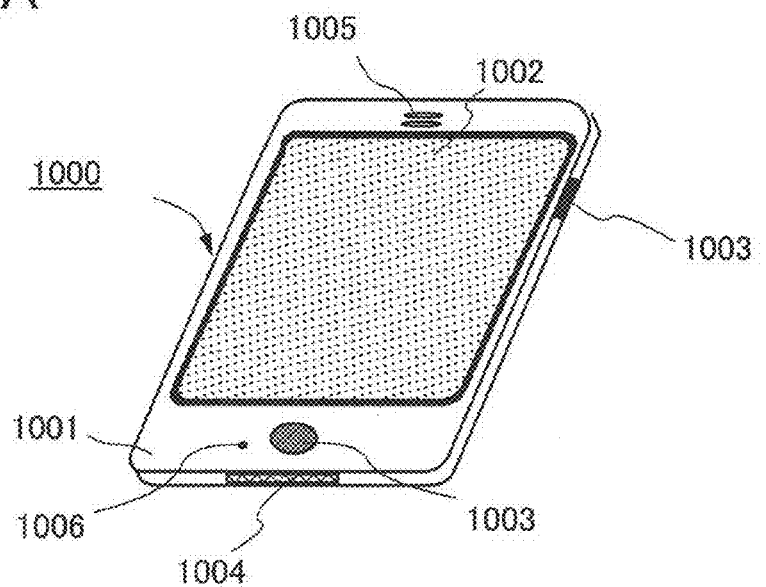
FIGS. 19A and 19B are perspective views of electronic appliances.

FIG. 19A illustrates an example of a cellular phone 1000. The cellular phone 1000 includes a display portion 1002 incorporated in a housing 1001, an operation button 1003, an external connection port 1004, a speaker 1005, a microphone 1006, and the like.

Data can be input to the cellular phone 1000 illustrated in FIG. 19A when the display portion 1002 is touched with a finger or the like. When the display portion 1002 is touched with a finger or the like, operations such as making calls and composing mails can also be performed.

There are mainly three screen modes of the display portion 1002. The first mode is a display mode mainly for displaying images, and the second mode is an input mode mainly for inputting data such as text. The third mode is a display-and-input mode in which the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost the whole area of the screen of the display portion 1002.

When the cellular phone 1000 is provided with a detection device including a sensor for detecting inclination, such as a gyroscope or an acceleration sensor, display on the screen of the display portion 1002 can be automatically switched by determining the installation direction of the cellular phone 1000 (whether the cellular phone 1000 is placed horizontally or vertically for a landscape mode or a portrait mode).

The screen mode is switched by touching the display portion 1002 or operating the operation button 1003 of the housing 1001. Alternatively, the screen mode may be switched depending on the kind of image displayed on the display portion 1002. For example, when an image signal displayed on the display portion is moving image data, the screen mode is switched to the display mode. When the image signal is text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 may function as an image sensor. For example, when an image of a palm print, a fingerprint, or the like is taken by touching the display portion 1002 with the palm or the finger, personal authentication can be performed. Further, when a backlight or a sensing light source which emits a near-infrared light is used in the display portion, an image of a finger vein, a palm vein, or the like can be taken.

Figure 19B:
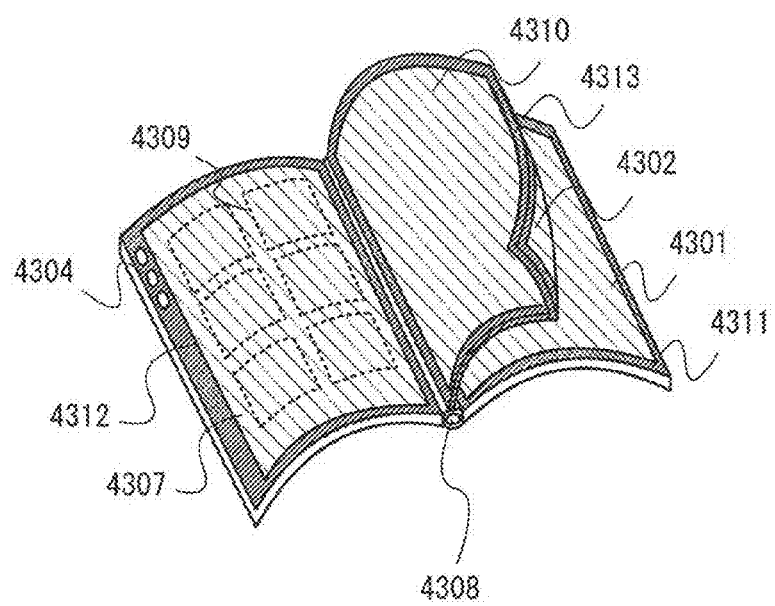

FIG. 19B is a perspective view illustrating an example of an e-book reader. The e-book reader of FIG. 19B includes a plurality of display panels. A third display panel with dual display is provided between a first display panel 4311 and a second display panel 4312, and the e-book reader is opened.

The e-book reader of FIG. 19B includes the first display panel 4311 having a first display portion 4301, the second display panel 4312 having an operation portion 4304 and a second display portion 4307, the third display panel 4313 having a third display portion 4302 and a fourth display portion 4310, and a binding portion 4308 provided in one end portion of the first display panel 4311, the second display panel 4312, and the third display panel 4313. The third display panel 4313 is interposed between the first display panel 4311 and the second display panel 4312. The e-book reader of FIG. 19B includes four display screens: the first display portion 4301, the second display portion 4307, the third display portion 4302, and the fourth display portion 4310.

The first display panel 4311, the second display panel 4312, and the third display panel 4313 are flexible and easy to bend. When the first display panel 4311 and the second display panel 4312 are formed using plastic substrates and the third display panel 4313 is formed using a thin film, the e-book reader can be made thin.

The third display panel 4313 is a dual display panel having the third display portion 4302 and the fourth display portion 4310. Alternatively, two liquid crystal display panels between which a backlight (preferably a thin EL light-emitting panel) is interposed may be used for the third display panel 4313. Note that a liquid crystal display panel is not necessarily used for all the first display panel 4311, the second display panel 4312, and the third display panel 4313, and an EL light-emitting display panel or electronic paper may also be used. That is, the liquid crystal display device of Embodiments 1 to 7 is used for at least one of the three display panels. When one e-book reader includes various kinds of display panels, an electronic paper display panel can be used outdoors in bright sunlight and the other panels are turned off so that power consumption is reduced, and a liquid crystal display panel can be used in a dark environment to display images. The electronic paper is advantageous in that, after an image is displayed once, the image can be kept even when the electronic paper is turned off. Meanwhile, it is difficult to display an image on the electronic paper in a dark environment because the electronic paper is a reflective display device. Accordingly, an e-book reader including various kinds of display panels can be used in any place. Further, at least one of the three display panels may be used for displaying full-color images, and the other display panels may be used for displaying monochrome images.

In the e-book reader illustrated in FIG. 19B, the second display panel 4312 includes the operation portion 4304, which can operate as a power supply input switch, a display switching switch, and the like.

Data can be input to the e-book reader illustrated in FIG. 19B when the first display portion 4301 or the second display portion 4307 is touched with a finger or an input pen or when the operation portion 4304 is operated. Note that display buttons 4309 are displayed on the second display portion 4307 in FIG. 19B, and data can be input to the e-book reader when the display buttons 4309 are touched with a finger or the like.

This application is based on Japanese Patent Application serial No. 2009-131384 filed with Japan Patent Office on May 29, 2009, the entire contents of which are hereby incorporated by reference.

What is claimed is:

1. A liquid crystal display device comprising:
   a first substrate;
   a first structure body, a second structure body, and a third structure body over the first substrate, wherein each of the first to third structure bodies protrudes from the first substrate;
   a first electrode layer over the first structure body, the second structure body, and the third structure body, wherein the first electrode layer is electrically connected to one of source and drain electrode layers of a transistor;
   an insulating layer over the first electrode layer, the insulating layer protruding from the first substrate due to the protrusion of each of the first to third structure bodies;
   a second electrode layer over the insulating layer, the second electrode layer overlapping a side surface of the first structure body and a side surface of the third structure body;
   a liquid crystal layer over the second electrode layer, the liquid crystal layer being capable of exhibiting a blue phase; and
   a second substrate over the liquid crystal layer,
   wherein the second electrode layer includes an opening,
   wherein the second structure body is provided between the first structure body and the third structure body, and
   wherein the opening of the second electrode layer overlaps the second structure body.

2. The liquid crystal display device according to claim 1, wherein the first structure body, the second structure body, and the third structure body comprise an organic resin material.

3. The liquid crystal display device according to claim 1, wherein each of the first to third structure bodies protrude within the liquid crystal layer.

4. The liquid crystal display device according to claim 1, further comprising a third electrode layer between the liquid crystal layer and the second substrate,
   wherein the third electrode layer is configured to be applied with a fixed potential.

5. The liquid crystal display device according to claim 1,
   wherein the first electrode layer is directly connected to one of the source and the drain electrode layers of the transistor, and
   wherein the second electrode layer is configured to be applied with a fixed potential.

6. The liquid crystal display device according to claim 1, further comprising a third electrode layer between the liquid crystal layer and the second substrate,
   wherein the third electrode layer is configured to be applied with a fixed potential, and
   wherein the third electrode layer overlaps the second electrode layer with the liquid crystal layer interposed therebetween.

7. The liquid crystal display device according to claim 1,
   wherein the insulating layer comprises an inorganic insulating material.

8. The liquid crystal display device according to claim 1,
   wherein the first structure body, the second structure body, and the third structure body are arranged at a regular interval.

9. The liquid crystal display device according to claim 1,
   wherein the insulating layer is in direct contact with the first electrode layer and the second electrode layer.

10. The liquid crystal display device according to claim 1,
    wherein the second electrode layer is in direct contact with the liquid crystal layer.

11. The liquid crystal display device according to claim 1,
    wherein the first to third structure bodies are in the same plane with the transistor.

12. The liquid crystal display device according to claim 1,
    wherein the second electrode protrudes from the first substrate due to the protrusion of the first to third structure bodies.

13. The liquid crystal display device according to claim 1,
    wherein the first to third structure bodies do not overlap with the transistor.

14. A liquid crystal display device comprising:
    a first substrate;
    first to third structure bodies over the first substrate, wherein each of the first to third structure bodies is arranged to protrude from the first substrate;
    a first electrode layer over the first to third structure bodies, wherein the first electrode layer is electrically connected to one of source and drain electrode layers of a transistor;
    an insulating layer over the first electrode layer, the insulating layer being arranged to protrude from the first substrate due to the protrusion of each of the first to third structure bodies;
    a second electrode layer over the insulating layer;

a liquid crystal layer over the second electrode layer, the liquid crystal layer being capable of exhibiting a blue phase; and a second substrate over the liquid crystal layer.

15. The liquid crystal display device according to claim 14, wherein the first to third structure bodies comprise an organic resin material.

16. The liquid crystal display device according to claim 14, wherein each of the first to third structure bodies protrude within the liquid crystal layer.

17. The liquid crystal display device according to claim 14, further comprising a third electrode layer between the liquid crystal layer and the second substrate,
wherein the third electrode layer is configured to be applied with a fixed potential.

18. The liquid crystal display device according to claim 14, wherein the first electrode layer is directly connected to one of the source and the drain electrode layers of the transistor, and
wherein the second electrode layer is configured to be applied with a fixed potential.

19. The liquid crystal display device according to claim 14, further comprising a third electrode layer between the liquid crystal layer and the second substrate,
wherein the third electrode layer is configured to be applied with a fixed potential, and
wherein the third electrode layer overlaps the second electrode layer with the liquid crystal layer interposed therebetween.

20. The liquid crystal display device according to claim 14, wherein the first to third structure bodies are arranged at a regular interval.

21. The liquid crystal display device according to claim 14, wherein the second electrode layer includes an opening which overlaps the second structure body, and
wherein the second structure body is located between the first structure body and the third structure body.

22. The liquid crystal display device according to claim 14, wherein the insulating layer is in direct contact with the first electrode layer and the second electrode layer.

23. The liquid crystal display device according to claim 14, wherein the second electrode layer is in direct contact with the liquid crystal layer.

24. The liquid crystal display device according to claim 14, wherein the first to third structure bodies are in the same plane with the transistor.

25. The liquid crystal display device according to claim 14, wherein the second electrode protrudes from the first substrate due to the protrusion of the first to third structure bodies.

26. The liquid crystal display device according to claim 14, wherein the first to third structure bodies do not overlap with the transistor.

* * * * *